US010324683B2

(12) United States Patent
Winton et al.

(10) Patent No.: US 10,324,683 B2
(45) Date of Patent: Jun. 18, 2019

(54) CONTROL FOR VEHICLE SOUND OUTPUT

(71) Applicant: Harman International Industries, Incorporated, Stamford, CT (US)

(72) Inventors: Riley Winton, Canton, MI (US); Chris Ludwig, Birmingham, MI (US)

(73) Assignee: Harman International Industries, Incorporated, Stamford, CT (US)

( * ) Notice: Subject to any disclaimer, the term of this patent is extended or adjusted under 35 U.S.C. 154(b) by 189 days.

(21) Appl. No.: 15/391,330

(22) Filed: Dec. 27, 2016

(65) Prior Publication Data
US 2018/0181365 A1 Jun. 28, 2018

(51) Int. Cl.
*G06F 3/16* (2006.01)
*G06F 3/0484* (2013.01)
*H05B 37/02* (2006.01)
*B60Q 3/80* (2017.01)
*H03G 3/30* (2006.01)
*H03G 3/32* (2006.01)
*H03G 5/02* (2006.01)

(52) U.S. Cl.
CPC .............. *G06F 3/165* (2013.01); *B60Q 3/80* (2017.02); *G06F 3/04845* (2013.01); *G06F 3/04847* (2013.01); *H03G 3/3005* (2013.01); *H03G 3/32* (2013.01); *H05B 37/0227* (2013.01); *G06F 3/04842* (2013.01); *H03G 5/025* (2013.01)

(58) Field of Classification Search
CPC .. G06F 3/165; G06F 3/04845; G06F 3/04842; B60Q 3/0293; H05B 37/0227
See application file for complete search history.

(56) References Cited

U.S. PATENT DOCUMENTS

| 8,068,105 | B1 * | 11/2011 | Classen | G06T 11/206 345/440 |
| 8,325,944 | B1 * | 12/2012 | Duwenhorst | H04R 3/00 381/119 |
| 9,604,651 | B1 * | 3/2017 | Amireddy | B60W 50/08 |
| 2004/0264704 | A1 * | 12/2004 | Huin | H04S 7/301 381/59 |

(Continued)

OTHER PUBLICATIONS

"Beoplay App", Beoplay.com, Available Online at https://www.beoplay.com/products/beoplayapp#lifestyle, Website Available as Early as Jan. 28, 2016, Retrieved on Dec. 27, 2016, 9 pages.

*Primary Examiner* — Mandrita Brahmachari
(74) *Attorney, Agent, or Firm* — McCoy Russell LLP

(57) ABSTRACT

Embodiments are provided for outputting audio according to a simulated listening environment. An example computing device for adjusting audio output in a physical listening environment includes a display configured to present a user interface, a communication interface coupled to one or more speakers, a processor, and a storage device storing instructions executable by the processor to generate the user interface for presentation via the display, receive user input to the user interface requesting one or more adjustments to the audio output in the physical listening environment, the one or more adjustments including a geometric parameter of a simulated listening environment, and transmit, via the communication interface, instructions for performing the one or more requested adjustments to audio output by the one or more speakers.

20 Claims, 23 Drawing Sheets
(14 of 23 Drawing Sheet(s) Filed in Color)

(56) References Cited

U.S. PATENT DOCUMENTS

| | | | |
|---|---|---|---|
| 2006/0066629 A1* | 3/2006 | Norlander | G06Q 30/02 345/594 |
| 2013/0002802 A1* | 1/2013 | Mock | H04L 12/1827 348/14.03 |
| 2014/0229840 A1* | 8/2014 | Wardenaar | G06Q 10/107 715/736 |
| 2015/0334505 A1* | 11/2015 | Crutchfield | H04S 7/40 381/17 |
| 2016/0286328 A1* | 9/2016 | Li | H04R 29/008 |
| 2017/0094437 A1* | 3/2017 | Kadri | H04R 5/02 |
| 2017/0166056 A1* | 6/2017 | Buttolo | B60K 37/06 |

* cited by examiner

CONTROL FOR VEHICLE SOUND OUTPUT

FIELD

The disclosure relates to systems, methods, and user interfaces for controlling various qualities of sound output by speakers in a vehicle.

BACKGROUND

Audio systems in some environments, such as vehicles, may be tuned to address challenges that may be present in the environments, such as small spaces, erratic sound obstacles, low speaker power, static speaker arrangement, and/or other considerations. An audio amplifier within an audio system may include a digital signal processor (DSP) enabling control over many parameters affecting the sound system's acoustic output.

SUMMARY

In some audio systems, audio tuning may be programmed into the amplifier based on an estimation of the listening environment, and users may be left with few controls such as bass, treble, balance, and fade to personalize the audio system to respective audio tastes. Embodiments are disclosed for increasing user control over the listening environment by providing a user interface for adjusting audio output to simulate a selected virtual listening environment. An example computing device for adjusting audio output in a physical listening environment includes a display configured to present a user interface, a communication interface coupled to one or more speakers, a processor, and a storage device storing instructions executable by the processor to generate the user interface for presentation via the display, receive user input to the user interface requesting one or more adjustments to the audio output in the physical listening environment, the one or more adjustments including a geometric parameter of a simulated listening environment, and transmit, via the communication interface, instructions for performing the one or more requested adjustments to audio output by the one or more speakers.

An example method for adjusting audio output in a vehicle includes presenting a user interface via a display in the vehicle, receiving user input to the user interface requesting one or more adjustments to the audio output in the vehicle, the one or more adjustments including a geometric parameter of a simulated listening environment, and transmitting instructions to one or more speakers of the vehicle for performing the one or more requested adjustments to audio output in the vehicle.

An example in-vehicle computing system of a vehicle for adjusting audio output includes a display device configured to present a user interface, a communication interface coupled to one or more speakers of the vehicle, a processor, and a storage device storing instructions executable by the processor to display the user interface via the display device, the user interface including a first control for changing a size of a simulated venue in which audio is output by the one or more speakers, and the user interface including a second control for changing a distance from a stage of the simulated venue at which output audio is simulated to be perceived, receive user input to the user interface requesting one or more adjustments to the audio output in the vehicle according to the simulated venue, and transmit, via the communication interface, instructions for performing the one or more requested adjustments to audio output by the one or more speakers.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The disclosure may be better understood from reading the following description of non-limiting embodiments, with reference to the attached drawings, wherein below.

DETAILED DESCRIPTION

Audio systems that are pre-tuned for an estimated listening environment may result in a stale listening experience that is not able to be dynamically adjusted according to a user's request. For example, a user may make minor adjustments to treble, bass, balance, and fade in such pre-tuned audio systems. However, any additional adjustments may not be accommodated. Accordingly, the disclosure provides an audio system and user interface for providing controls for adjusting audio output in a listening environment, such as a vehicle. The controls may include controls for configuring a simulated environment in which audio may be perceived to be output.

Figure 1:
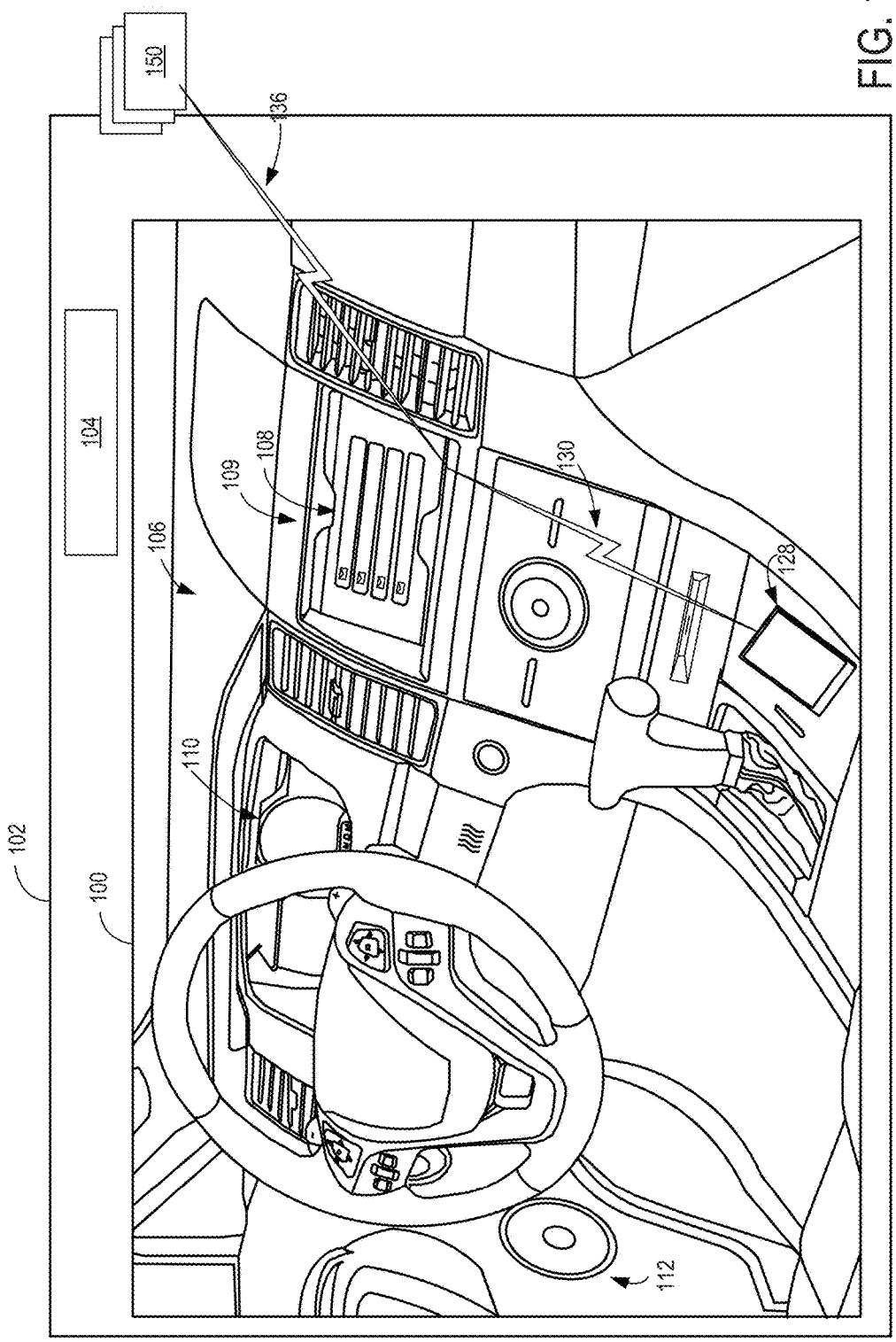
FIG. 1 shows an example partial view of a vehicle cabin in accordance with one or more embodiments of the present disclosure.

FIG. 1 shows an example partial view of one type of environment for an audio customization system: an interior of a cabin 100 of a vehicle 102, in which a driver and/or one or more passengers may be seated. Vehicle 102 of FIG. 1 may be a motor vehicle including drive wheels (not shown) and an internal combustion engine 104. Internal combustion engine 104 may include one or more combustion chambers which may receive intake air via an intake passage and exhaust combustion gases via an exhaust passage. Vehicle 102 may be a road automobile, among other types of vehicles. In some examples, vehicle 102 may include a hybrid propulsion system including an energy conversion device operable to absorb energy from vehicle motion and/or the engine and convert the absorbed energy to an energy form suitable for storage by an energy storage device. Vehicle 102 may include a fully electric vehicle, incorporating fuel cells, solar energy capturing elements, and/or other energy storage systems for powering the vehicle.

As shown, an instrument panel 106 may include various displays and controls accessible to a driver (also referred to as the user) of vehicle 102. For example, instrument panel 106 may include a touch screen 108 of an in-vehicle computing system 109 (e.g., an infotainment system), an audio system control panel, and an instrument cluster 110. While the example system shown in FIG. 1 includes audio system controls that may be performed via a user interface of in-vehicle computing system 109, such as touch screen 108 without a separate audio system control panel, in other embodiments, the vehicle may include an audio system control panel, which may include controls for a conventional vehicle audio system such as a radio, compact disc player, MP3 player, etc. The audio system controls may include features for controlling one or more aspects of audio output via speakers 112 of a vehicle speaker system. For example, the in-vehicle computing system or the audio system controls may control a volume of audio output, a distribution of sound among the individual speakers of the vehicle speaker system, an equalization of audio signals, and/or any other aspect of the audio output. In further examples, in-vehicle computing system 109 may adjust a radio station selection, a playlist selection, a source of audio input (e.g., from radio or CD or MP3), etc., based on user input received directly via touch screen 108, or based on data regarding the user (such as a physical state and/or environment of the user) received via external devices 150 and/or mobile device 128. The audio system of the vehicle may include an amplifier (not shown) coupled to plurality of loudspeakers (not shown). In some embodiments, one or more hardware elements of in-vehicle computing system 109, such as touch screen 108, a display screen, various control dials, knobs and buttons, memory, processor(s), and any interface elements (e.g., connectors or ports) may form an integrated head unit that is installed in instrument panel 106 of the vehicle. The head unit may be fixedly or removably attached in instrument panel 106. In additional or alternative embodiments, one or more hardware elements of the in-vehicle computing system may be modular and may be installed in multiple locations of the vehicle.

The cabin 100 may include one or more sensors for monitoring the vehicle, the user, and/or the environment. For example, the cabin 100 may include one or more seat-mounted pressure sensors configured to measure the pressure applied to the seat to determine the presence of a user, door sensors configured to monitor door activity, humidity sensors to measure the humidity content of the cabin, microphones to receive user input in the form of voice commands, to enable a user to conduct telephone calls, and/or to measure ambient noise in the cabin 100, etc. It is to be understood that the above-described sensors and/or one or more additional or alternative sensors may be positioned in any suitable location of the vehicle. For example, sensors may be positioned in an engine compartment, on an external surface of the vehicle, and/or in other suitable locations for providing information regarding the operation of the vehicle, ambient conditions of the vehicle, a user of the vehicle, etc. Information regarding ambient conditions of the vehicle, vehicle status, or vehicle driver may also be received from sensors external to/separate from the vehicle (that is, not part of the vehicle system), such as sensors coupled to external devices 150 and/or mobile device 128. The sensed information regarding the cabin of the vehicle and/or the environment external to the vehicle may be evaluated to determine audio-related characteristics of the space (e.g., a transfer function of the cabin, objects that may interfere with the propagation of sound waves, etc.). In this way, the sensed information may be evaluated to determine adjustments that may be made to output audio in order to simulate sound output within a selected venue and/or to simulate sound perceived at a particular location within a simulated venue (e.g., when perceived from the cabin of the vehicle and/or a particular location within the cabin of the vehicle, such as a driver seat and/or a passenger seat).

Cabin 100 may also include one or more user objects, such as mobile device 128, that are stored in the vehicle before, during, and/or after travelling. The mobile device 128 may include a smart phone, a tablet, a laptop computer, a portable media player, and/or any suitable mobile computing device. The mobile device 128 may be connected to the in-vehicle computing system via communication link 130. The communication link 130 may be wired (e.g., via Universal Serial Bus [USB], Mobile High-Definition Link [MHL], High-Definition Multimedia Interface [HDMI], Ethernet, etc.) or wireless (e.g., via BLUETOOTH, WIFI, WIFI direct, Near-Field Communication [NFC], cellular connectivity, etc.) and configured to provide two-way communication between the mobile device and the in-vehicle computing system. The mobile device 128 may include one or more wireless communication interfaces for connecting to one or more communication links (e.g., one or more of the example communication links described above). The wireless communication interface may include one or more physical devices, such as antenna(s) or port(s) coupled to data lines for carrying transmitted or received data, as well as one or more modules/drivers for operating the physical devices in accordance with other devices in the mobile device. For example, the communication link 130 may provide sensor and/or control signals from various vehicle systems (such as vehicle audio system, climate control system, etc.) and the touch screen 108 to the mobile device 128 and may provide control (e.g., to control sound output within the vehicle) and/or display signals from the mobile device 128 to the in-vehicle systems and the touch screen 108. The communication link 130 may also provide power to the mobile device 128 from an in-vehicle power source in order to charge an internal battery of the mobile device.

In-vehicle computing system 109 may also be communicatively coupled to additional devices operated and/or accessed by the user but located external to vehicle 102, such as one or more external devices 150. In the depicted embodiment, external devices are located outside of vehicle 102 though it will be appreciated that in alternate embodiments, external devices may be located inside cabin 100. The external devices may include a server computing system, personal computing system, portable electronic device, electronic wrist band, electronic head band, portable music player, electronic activity tracking device, pedometer, smartwatch, GPS system, etc. External devices 150 may be connected to the in-vehicle computing system via communication link 136 which may be wired or wireless, as described with reference to communication link 130, and configured to provide two-way communication between the external devices and the in-vehicle computing system. For example, external devices 150 may include one or more sensors and communication link 136 may transmit sensor output from external devices 150 to in-vehicle computing system 109 and touch screen 108. External devices 150 may also store and/or receive information regarding contextual data, user behavior/preferences, operating rules, etc. and may transmit such information from the external devices 150 to in-vehicle computing system 109 and touch screen 108.

In-vehicle computing system 109 may analyze the input received from external devices 150, mobile device 128, and/or other input sources and select settings for various in-vehicle systems (such as an audio system), provide output via touch screen 108 and/or speakers 112, communicate with mobile device 128 and/or external devices 150, and/or perform other actions based on the assessment. In some embodiments, all or a portion of the assessment may be performed by the mobile device 128 and/or the external devices 150.

In some embodiments, one or more of the external devices 150 may be communicatively coupled to in-vehicle computing system 109 indirectly, via mobile device 128 and/or another of the external devices 150. For example, communication link 136 may communicatively couple external devices 150 to mobile device 128 such that output from external devices 150 is relayed to mobile device 128. Data received from external devices 150 may then be aggregated at mobile device 128 with data collected by mobile device 128, the aggregated data then transmitted to in-vehicle computing system 109 and touch screen 108 via communication link 130. Similar data aggregation may occur at a server system and then transmitted to in-vehicle computing system 109 and touch screen 108 via communication link 136/130.

Figure 2:
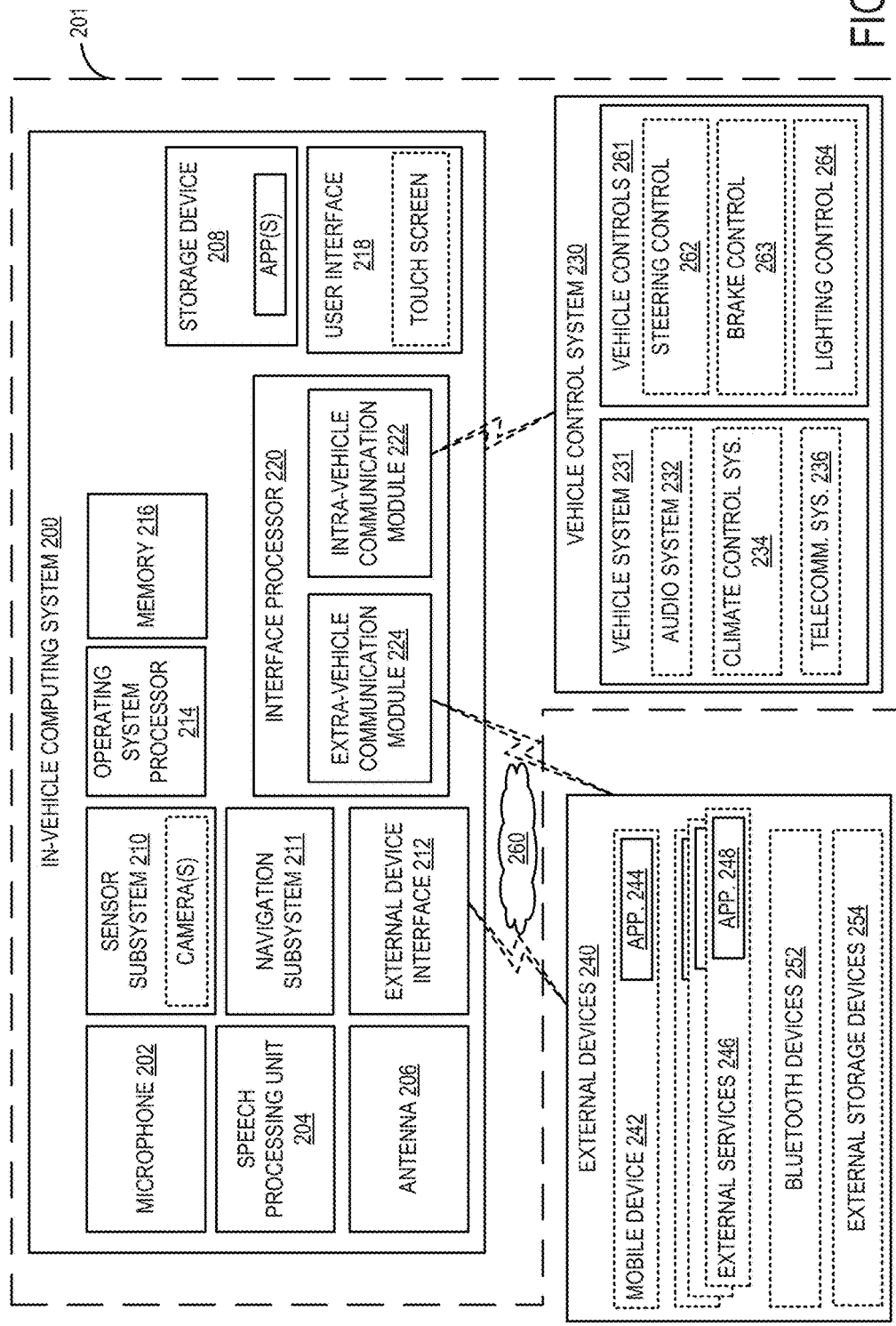
FIG. 2 shows a block diagram of an in-vehicle computing system in accordance with one or more embodiments of the present disclosure.

FIG. 2 shows a block diagram of an in-vehicle computing system 200 configured and/or integrated inside vehicle 201. In-vehicle computing system 200 may be an example of in-vehicle computing system 109 of FIG. 1 and/or may perform one or more of the methods described herein in some embodiments. In some examples, the in-vehicle computing system may be a vehicle infotainment system configured to provide information-based media content (audio and/or visual media content, including entertainment content, navigational services, etc.) to a vehicle user to enhance the operator's in-vehicle experience. The vehicle infotainment system may include, or be coupled to, various vehicle systems, sub-systems, hardware components, as well as software applications and systems that are integrated in, or integratable into, vehicle 201 in order to enhance an in-vehicle experience for a driver and/or a passenger.

In-vehicle computing system 200 may include one or more processors including an operating system processor 214 and an interface processor 220. Operating system processor 214 may execute an operating system on the in-vehicle computing system, and control input/output, display, playback, and other operations of the in-vehicle computing system. Interface processor 220 may interface with a vehicle control system 230 via an inter-vehicle system communication module 222.

Inter-vehicle system communication module 222 may output data to other vehicle systems 231 and vehicle control elements 261, while also receiving data input from other vehicle components and systems 231, 261, e.g. by way of vehicle control system 230. When outputting data, inter-vehicle system communication module 222 may provide a signal via a bus corresponding to any status of the vehicle, the vehicle surroundings, or the output of any other information source connected to the vehicle. Vehicle data outputs may include, for example, analog signals (such as current velocity), digital signals provided by individual information sources (such as clocks, thermometers, location sensors such as Global Positioning System [GPS] sensors, etc.), digital signals propagated through vehicle data networks (such as an engine controller area network [CAN] bus through which engine related information may be communicated, a climate control CAN bus through which climate control related information may be communicated, and a multimedia data network through which multimedia data is communicated between multimedia components in the vehicle). For example, the in-vehicle computing system may retrieve from the engine CAN bus the current speed of the vehicle estimated by the wheel sensors, a power state of the vehicle via a battery and/or power distribution system of the vehicle, an ignition state of the vehicle, etc. In addition, other interfacing means such as Ethernet may be used as well without departing from the scope of this disclosure.

A non-volatile storage device 208 may be included in in-vehicle computing system 200 to store data such as instructions executable by processors 214 and 220 in non-volatile form. The storage device 208 may store application data to enable the in-vehicle computing system 200 to run an application for connecting to a cloud-based server and/or collecting information for transmission to the cloud-based server. The application may retrieve information gathered by vehicle systems/sensors, input devices (e.g., user interface 218), devices in communication with the in-vehicle computing system (e.g., a mobile device connected via a Bluetooth link), etc. In-vehicle computing system 200 may further include a volatile memory 216. Volatile memory 216 may be random access memory (RAM). Non-transitory storage devices, such as non-volatile storage device 208 and/or volatile memory 216, may store instructions and/or code that, when executed by a processor (e.g., operating system processor 214 and/or interface processor 220), controls the in-vehicle computing system 200 to perform one or more of the actions described in the disclosure.

A microphone 202 may be included in the in-vehicle computing system 200 to receive voice commands from a user, to measure ambient noise in the vehicle, to determine whether audio from speakers of the vehicle is tuned in accordance with an acoustic environment of the vehicle, etc. A speech processing unit 204 may process voice commands, such as the voice commands received from the microphone 202. In some embodiments, in-vehicle computing system 200 may also be able to receive voice commands and sample ambient vehicle noise using a microphone included in an audio system 232 of the vehicle.

One or more additional sensors may be included in a sensor subsystem 210 of the in-vehicle computing system 200. For example, the sensor subsystem 210 may include a camera, such as a rear view camera for assisting a user in parking the vehicle and/or a cabin camera for identifying a user (e.g., using facial recognition and/or user gestures). Sensor subsystem 210 of in-vehicle computing system 200 may communicate with and receive inputs from various vehicle sensors and may further receive user inputs. For example, the inputs received by sensor subsystem 210 may include transmission gear position, transmission clutch position, gas pedal input, brake input, transmission selector position, vehicle speed, engine speed, mass airflow through the engine, ambient temperature, intake air temperature, etc., as well as inputs from climate control system sensors (such as heat transfer fluid temperature, antifreeze temperature, fan speed, passenger compartment temperature, desired passenger compartment temperature, ambient humidity, etc.), an audio sensor detecting voice commands issued by a user, a fob sensor receiving commands from and optionally tracking the geographic location/proximity of a fob of the vehicle, etc. While certain vehicle system sensors may communicate with sensor subsystem 210 alone, other sensors may communicate with both sensor subsystem 210 and vehicle control system 230, or may communicate with sensor subsystem 210 indirectly via vehicle control system 230. A navigation subsystem 211 of in-vehicle computing system 200 may generate and/or receive navigation information such as location information (e.g., via a GPS sensor and/or other sensors from sensor subsystem 210), route guidance, traffic information, point-of-interest (POI) identification, and/or provide other navigational services for the driver.

External device interface 212 of in-vehicle computing system 200 may be coupleable to and/or communicate with one or more external devices 240 located external to vehicle 201. While the external devices are illustrated as being located external to vehicle 201, it is to be understood that they may be temporarily housed in vehicle 201, such as when the user is operating the external devices while operating vehicle 201. In other words, the external devices 240 are not integral to vehicle 201. The external devices 240 may include a mobile device 242 (e.g., connected via a Bluetooth, NFC, WIFI direct, or other wireless connection) or an alternate Bluetooth-enabled device 252. Mobile device 242 may be a mobile phone, smart phone, wearable devices/sensors that may communicate with the in-vehicle computing system via wired and/or wireless communication, or other portable electronic device(s). Other external devices include external services 246. For example, the external devices may include extra-vehicular devices that are separate from and located externally to the vehicle. Still other external devices include external storage devices 254, such as solid-state drives, pen drives, USB drives, etc. External devices 240 may communicate with in-vehicle computing system 200 either wirelessly or via connectors without departing from the scope of this disclosure. For example, external devices 240 may communicate with in-vehicle computing system 200 through the external device interface 212 over network 260, a universal serial bus (USB) connection, a direct wired connection, a direct wireless connection, and/or other communication link.

The external device interface 212 may provide a communication interface to enable the in-vehicle computing system to communicate with mobile devices associated with contacts of the driver. For example, the external device interface 212 may enable phone calls to be established and/or text messages (e.g., SMS, MMS, etc.) to be sent (e.g., via a cellular communications network) to a mobile device associated with a contact of the driver. The external device interface 212 may additionally or alternatively provide a wireless communication interface to enable the in-vehicle computing system to synchronize data with one or more devices in the vehicle (e.g., the driver's mobile device) via WIFI direct, as described in more detail below.

One or more applications 244 may be operable on mobile device 242. As an example, mobile device application 244 may be operated to aggregate user data regarding interactions of the user with the mobile device. For example, mobile device application 244 may aggregate data regarding music playlists listened to by the user on the mobile device, telephone call logs (including a frequency and duration of telephone calls accepted by the user), positional information including locations frequented by the user and an amount of time spent at each location, etc. The collected data may be transferred by application 244 to external device interface 212 over network 260. In addition, specific user data requests may be received at mobile device 242 from in-vehicle computing system 200 via the external device interface 212. The specific data requests may include requests for determining where the user is geographically located, an ambient noise level and/or music genre at the user's location, an ambient weather condition (temperature, humidity, etc.) at the user's location, etc. Mobile device application 244 may send control instructions to components (e.g., microphone, amplifier etc.) or other applications (e.g., navigational applications) of mobile device 242 to enable the requested data to be collected on the mobile device or requested adjustment made to the components. Mobile device application 244 may then relay the collected information back to in-vehicle computing system 200.

Likewise, one or more applications 248 may be operable on external services 246. As an example, external services applications 248 may be operated to aggregate and/or analyze data from multiple data sources. For example, external services applications 248 may aggregate data from one or more social media accounts of the user, data from the in-vehicle computing system (e.g., sensor data, log files, user input, etc.), data from an internet query (e.g., weather data, POI data), etc. The collected data may be transmitted to another device and/or analyzed by the application to determine a context of the driver, vehicle, and environment and perform an action based on the context (e.g., requesting/sending data to other devices).

Vehicle control system 230 may include controls for controlling aspects of various vehicle systems 231 involved in different in-vehicle functions. These may include, for example, controlling aspects of vehicle audio system 232 for providing audio entertainment to the vehicle occupants, aspects of climate control system 234 for meeting the cabin cooling or heating needs of the vehicle occupants, as well as aspects of telecommunication system 236 for enabling vehicle occupants to establish telecommunication linkage with others.

Audio system 232 may include one or more acoustic reproduction devices including electromagnetic transducers such as speakers. Vehicle audio system 232 may be passive or active such as by including a power amplifier. In some examples, in-vehicle computing system 200 may be the only audio source for the acoustic reproduction device or there may be other audio sources that are connected to the audio reproduction system (e.g., external devices such as a mobile phone). The connection of any such external devices to the audio reproduction device may be analog, digital, or any combination of analog and digital technologies.

Climate control system 234 may be configured to provide a comfortable environment within the cabin or passenger compartment of vehicle 201. Vehicle control system 230 may also include controls for adjusting the settings of various vehicle controls 261 (or vehicle system control elements) related to the engine and/or auxiliary elements within a cabin of the vehicle, such as steering wheel controls 262 (e.g., steering wheel-mounted audio system controls, cruise controls, windshield wiper controls, headlight controls, turn signal controls, etc.), instrument panel controls, microphone(s), accelerator/brake/clutch pedals, a gear shift, door/window controls positioned in a driver or passenger door, seat controls, cabin light controls, audio system controls, cabin temperature controls, etc. Vehicle controls 261 may also include internal engine and vehicle operation controls (e.g., engine controller module, actuators, valves, etc.) that are configured to receive instructions via the CAN bus of the vehicle to change operation of one or more of the engine, exhaust system, transmission, and/or other vehicle system.

The control signals may also control audio output at one or more speakers of the vehicle's audio system 232. For example, the control signals may adjust audio output characteristics such as volume, equalization, audio image (e.g., the configuration of the audio signals to produce audio output that appears to a user to originate from one or more defined locations), audio distribution among a plurality of speakers, etc.

Control elements positioned on an outside of a vehicle (e.g., controls for a security system) may also be connected to computing system 200, such as via communication module 222. The control elements of the vehicle control system may be physically and permanently positioned on and/or in the vehicle for receiving user input. In addition to receiving control instructions from in-vehicle computing system 200, vehicle control system 230 may also receive input from one or more external devices 240 operated by the user, such as from mobile device 242. This allows aspects of vehicle systems 231 and vehicle controls 261 to be controlled based on user input received from the external devices 240.

In-vehicle computing system 200 may further include an antenna 206. Antenna 206 is shown as a single antenna, but may comprise one or more antennas in some embodiments. The in-vehicle computing system may obtain broadband wireless internet access via antenna 206, and may further receive broadcast signals such as radio, television, weather, traffic, and the like. The in-vehicle computing system may receive positioning signals such as GPS signals via one or more antennas 206. The in-vehicle computing system may also receive wireless commands via RF such as via antenna(s) 206 or via infrared or other means through appropriate receiving devices. In some embodiments, antenna 206 may be included as part of audio system 232 or telecommunication system 236. Additionally, antenna 206 may provide AM/FM radio signals to external devices 240 (such as to mobile device 242) via external device interface 212.

One or more elements of the in-vehicle computing system 200 may be controlled by a user via user interface 218. User interface 218 may include a graphical user interface presented on a touch screen, such as touch screen 108 of FIG. 1, and/or user-actuated buttons, switches, knobs, dials, sliders, etc. For example, user-actuated elements may include steering wheel controls, door and/or window controls, instrument panel controls, audio system settings, climate control system settings, and the like. A user may also interact with one or more applications of the in-vehicle computing system 200 and mobile device 242 via user interface 218. In addition to receiving a user's vehicle setting preferences on user interface 218, vehicle settings selected by in-vehicle control system may be displayed to a user on user interface 218. Notifications and other messages (e.g., received messages), as well as navigational assistance, may be displayed to the user on a display of the user interface. User preferences, selections, and/or responses to presented messages may be performed via user input to the user interface.

Figure 3:
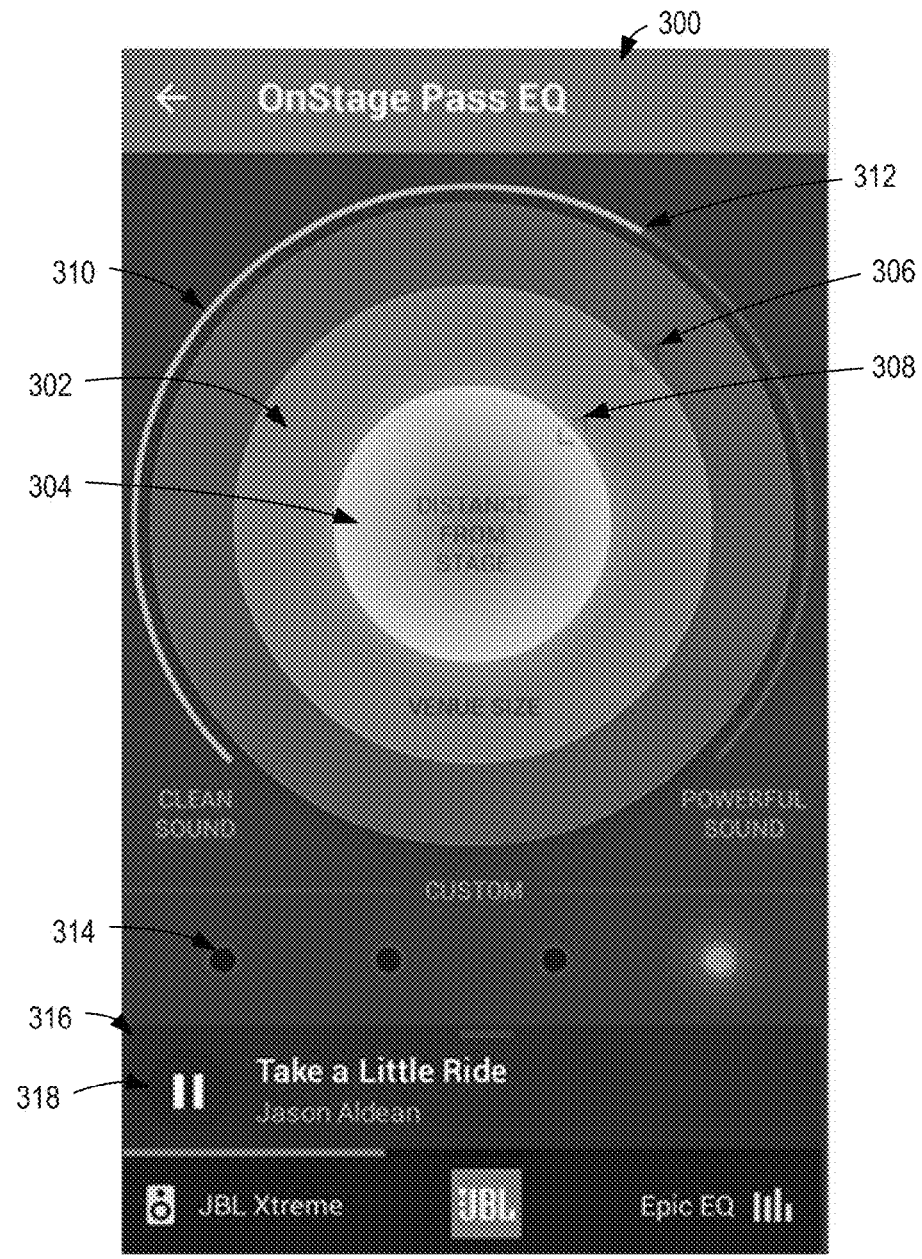
FIG. 3 shows an example user interface for adjusting audio settings and a simulated listening environment in accordance with one or more embodiments of the present disclosure.

The above-described in-vehicle computing systems may be utilized to provide a user interface for controlling audio output within a vehicle. For example, a user interface may provide controls for user selection and/or configuration of a virtual sound space (e.g., a music venue) to be simulated within a physical sound space (e.g., a cabin of a vehicle). A user interface may additionally or alternatively provide controls for user selection of particular sound qualities of sound output in the simulated sound space. FIG. 3 shows an example user interface 300 for controlling the output of sound in a vehicle, such as vehicle 102 of FIG. 1. User interface 300 may be used to control a single speaker or multiple speakers (e.g., all speakers, or a subset of speakers, such as all speakers of a particular type, all speakers configured to output a particular range of frequencies, etc.) and be used to send control instructions to each associated speaker (and/or an audio system that generates audio signals to be output by each associated speaker) to output sound according to user selections. User interface 300 may be displayed on a display of an in-vehicle computing system (e.g., in-vehicle computing system 109 of FIG. 1 and/or a display of a head unit of a vehicle) and/or a display of a mobile device (e.g., mobile device 128 of FIG. 1 and/or any other mobile device that is in communication with the vehicle).

User interface 300 may include any or all of the controls illustrated in FIG. 3, and additional or alternative controls to perform other sound output modifications may be provided without departing from the scope of the disclosure. The appearance of the controls of user interface 300 as illustrated in FIG. 3 is also exemplary in nature, and other layouts, colors, sizes, and/or additional displayable features may be utilized to form user interface 300 without departing from the scope of the disclosure. In some examples, the appearance of the user interface may be modified by the user, such that the user interface includes controls selected by a user and/or has an appearance (e.g., layout, color theme, etc.) selected by a user. In some examples, the user interface 300 may have a different appearance and/or functionality based on the type of display that is presenting the user interface. For example, if the user interface is displayed by an in-vehicle computing device or other display mounted in a vehicle, the user interface may have an appearance (e.g., a number, size, type, color of user interface controls and/or text) that is configured to reduce cognitive processing while providing input. As a more detailed example, when displayed on an in-vehicle computing system display, text and/or controls on the user interface may be larger, color differentiation for different settings may be more pronounced, the number of controls and/or amount of text may be reduced, etc. relative to the same text and/or controls displayed on other display devices (e.g., a mobile phone display).

In the illustrated example, user interface 300 includes two concentric circles: an outer circle 302 representing a size of a simulated sound space (e.g., a size of a simulated venue) and an inner circle 304 representing a distance from a simulated stage (e.g., a sound source location) of that sound space/venue at which the output sound is to be perceived (e.g., a simulated listening location within the simulated venue). The distance from the simulated stage may represent a distance from the stage along a horizontal plane (e.g., a horizontal plane positioned at a floor of the stage, at a selected distance above the floor of the stage, at a distance above the floor of the stage that is based on a height of the simulated venue [e.g., half of the height of the venue, level with a highest seat location in the venue, etc.], etc.). The distance from the simulated stage may additionally or alternatively represent a distance from the stage that includes an angle from the center of the stage, an elevation relative to the stage, etc. The distance may be represented by a number indicating a linear distance and an angle representing an azimuth extending between a location in the venue (e.g., a location at which the sound is to be perceived to be heard, which may be referred to as a listener location) and a stage of the venue (e.g., a location at which the sound is to be perceived to originate, which may be referred to as a sound source). In other examples, the distance may be represented by a number indicating a linear horizontal distance from the stage and a number indicating a linear vertical distance from the stage. In still other examples, the distance may be represented by a venue-specific designation, such as a section number indicating a region of the venue (e.g., first level, second level, floor, balcony, dress circle, mezzanine, etc.) and a row number indicating a location within that section (e.g., a distance from the front of that section, or a distance from the stage within that section).

In the illustrated example, each of the concentric circles may be resized by dragging an edge (e.g., a point on a circumference of the respective circle) of the circle in a direction towards the center of the concentric circles (to reduce the size/distance) or away from the center of the concentric circles (to increase the size/distance). In the illustrated example, each concentric circle may have a respective drag control (drag control 306 for the outer circle and drag control 308 for the inner circle). In some examples, each of the circles may be resized by providing input to the associated drag control to drag the control outward and away from the center of the circle (to increase the size/distance) and/or to drag the control inward and toward the center of the circle (to decrease the size/distance). In additional or alternative examples, such drag input may be provided anywhere along the circumferential edge of the associated circle. In some examples, additional or alternative input may be provided to resize the circles, such as gesture input (e.g., a pinch and pull input) performed within a circle to be resized. Another example input to change the size of the circles includes selecting a targeted circle (e.g., via a tap input or by speaking an identifier associated with the circle to be targeted) and inputting a requested size of the circle and/or a requested value for the associated parameter controlled by the targeted circle (e.g., venue size or distance from stage, or other geometric parameter relating to the simulated listening environment).

The inner circle 304 may have an adjustable size (e.g., a diameter) that ranges from 0 or some minimum value (e.g., representing a position that is closest to the stage of the simulated venue) to a maximum value (e.g., representing a position that is furthest from the stage of the simulated venue, which may be equal to the venue size, a threshold value less than the venue size, or a threshold percentage of the venue size). Accordingly, the maximum value for the size of the inner circle 304 may dynamically change as the venue size is changed. For example, if the outer circle 302 is adjusted to a size that is smaller than a current size of the inner circle 304, the inner circle may be automatically resized to be equal to or less than the size of the outer circle. The outer circle 302 may have an adjustable size (e.g., a diameter) that ranges from 0 or some minimum value (e.g., the same or a larger minimum value than that of the inner circle 304) to a maximum value (e.g., the same or a larger maximum value than that of the inner circle 304).

The minimum and maximum values for the size of the inner circle 304 may correspond to the smallest and largest distance from the stage that is able to be simulated by the speakers of the associated vehicle (or other environment) within the sound space (e.g., cabin) of the associated vehicle (or other environment). Similarly, the minimum and maximum values for the size of the outer circle 302 may correspond to the smallest and largest venue sizes that may be simulated using the speakers of the associated vehicle (or other environment) within the sound space (e.g., cabin) of the associated vehicle (or other environment). For example, a number of speakers, position of speakers, type of speakers, vehicle cabin layout (e.g., a transfer function of the vehicle cabin, corresponding to the size, shape, and/or dimensions of the cabin and the objects within the cabin), amount of ambient noise, and/or other environmental conditions or characteristics may influence the type or quality of sound that may by produced in the cabin. Accordingly, the available venue sizes and distances from the stage that may be simulated may be a function of the above-described conditions and characteristics.

Figure 4:
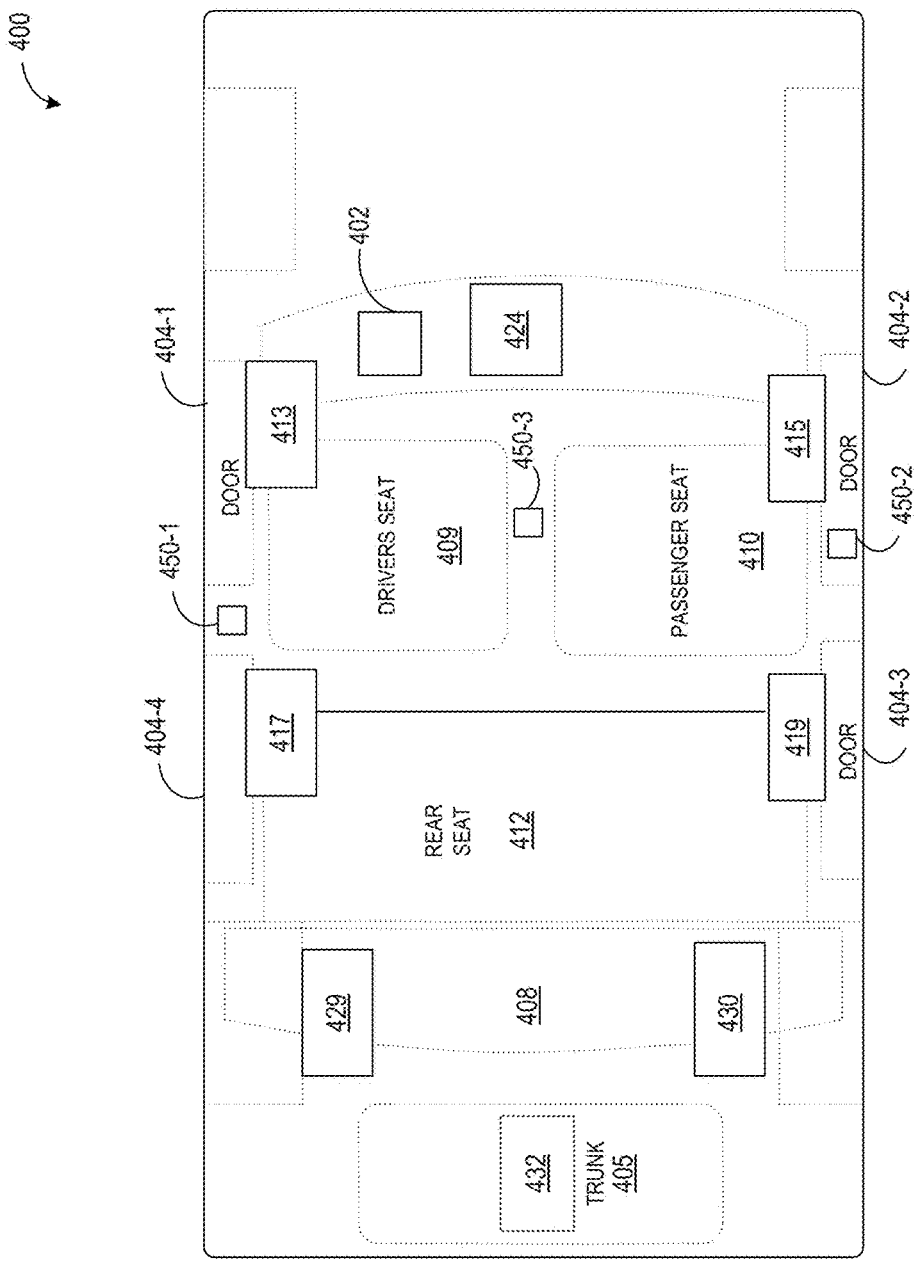
FIG. 4 shows an example sound processing system in a vehicle in accordance with one or more embodiments of the present disclosure.

Turning briefly to FIG. 4, an example vehicle 400 that includes an example audio or sound processing system 402 is illustrated. The audio or sound processing system 402 may be utilized to carry out the instructions generated responsive to input to the user interface 300 of FIG. 3 (and/or any of the other user interfaces described in the disclosure). The vehicle 400 may be an example of vehicle 102 of FIG. 1. The vehicle 400 includes doors 404, a driver seat 409, a passenger seat 410, and a rear seat 411. While a four-door vehicle is shown including doors 404-1, 404-2, 404-3, and 404-4, the audio system (AS) 102 may be used in vehicles having more or fewer doors. The vehicle 400 may be an automobile, truck, boat, or the like. Although only one rear seat is shown, larger vehicles may have multiple rows of rear seats. Smaller vehicles may have only one or more seats. While a particular example configuration is shown, other configurations may be used including those with fewer or additional components.

The audio system 402 (which may include an amplifier and/or other audio processing device for receiving, processing, and/or outputting audio to one or more speakers of the vehicle) may alter the spatial characteristics of surround sound systems. The audio system 402 supports the use of a variety of audio components such as radios, CDs, DVDs, their derivatives, and the like. The audio system 402 may use 2-channel source material such as direct left and right sources, 5.1 channel, 6.2 channel, 7 channel, 12 channel and/or any other source materials from a matrix decoder digitally encoded/decoded discrete source material, and the like. The amplitude and phase characteristics of the source material and the reproduction of specific sound field characteristics in the listening environment may contribute to the simulation of sound output in a specified sound space (e.g., an arena or other venue with a user-selected size and distance from a stage).

The audio system 402 may produce sound simulating a selected sound space by controlling the amplitude, phase, and mixing ratio between discrete and passive decoder surround signals and/or the direct two-channel output signals. The sound space simulation may be performed for all seating locations by re-orientation of the direct, passive, and active mixing and steering parameters, especially in a vehicle environment. The mixing and steering ratios as well as spectral characteristics may be adaptively modified as a function of the noise and other environmental factors. In a vehicle, information from the data bus (e.g., a controller-area network [CAN] bus), microphones, and/or other transduction devices may be used to control the mixing and steering parameters.

The vehicle 400 includes a front center speaker (CTR speaker) 424, a left front speaker (LF speaker) 413, a right front speaker (RF speaker) 415, and at least one pair of surround speakers. The surround speakers may include a left side speaker (LS speaker) 417 and a right side speaker (RS speaker) 419, a left rear speaker (LR speaker) 429 and a right rear speaker (RR speaker) 430, and/or a combination of speaker sets. Other speaker sets may be used. For example, one or more dedicated subwoofers 432 or other drivers may be present. Although the illustrated subwoofer 432 is shown mounted in the trunk 405 of the vehicle, possible additional or alternative subwoofer mounting locations include below a seat, on or in the rear shelf 408, under flooring of the passenger cabin, and/or elsewhere in the vehicle. The vehicle 400 may also include one or more microphones 450 mounted in the interior passenger cabin.

Each CTR speaker, LF speaker, RF speaker, LS speaker, RS speaker, LR speaker, and RR speaker may include one or more transducers of a predetermined range of frequency response such as a tweeter, a mid-range, or a woofer. The tweeter, mid-range, or woofer may be mounted adjacent to each other in essentially the same location or in different locations. For example, the LF speaker 413 may be a tweeter located in door 404-1 or elsewhere at a height roughly equivalent to a side mirror or higher. The RF speaker 415 may have a similar arrangement to LF speaker 413 on the right side of the vehicle (e.g., in door 404-2).

The LR speaker 429 and the RR speaker 430 may each be a woofer mounted in the rear shelf 408. The CTR speaker 424 may be mounted in the front dashboard 407, in the roof, on or near the rear-view mirror, or elsewhere in the vehicle 400. In other examples, other configurations of loudspeakers with other frequency response ranges are possible. In some embodiments, additional speakers may be added to an upper pillar in the vehicle to enhance the height of the sound image. For example, an upper pillar may include a vertical or near-vertical support of a car's window area. In some examples, the additional speakers may be added to an upper region of an "A" pillar toward a front of the vehicle (e.g., a pillar positioned between a passenger or driver window and a windshield of the vehicle).

Returning to FIG. 3, a sound characteristic adjustment element 310 may be presented as a semicircular shape (e.g., an arc) concentrically extending around a portion of the outer circle 302. The adjustment element 310 may be manipulated by providing input (e.g., tapping or otherwise selecting) a location on the semicircular shape of the adjustment element and/or by dragging a selectable element or region along the semicircular shape of the adjustment element (e.g., where the selectable element or region is positioned at a location of a current setting of the adjustment element, such as at a point 312 partway past the center of the semicircular shape in the illustrated example.

In the illustrated example, the adjustment element 310 adjusts a sound quality between a "clean sound" and a "powerful sound." For example, responsive to user input to position the adjustment element 310 at the lowest setting (e.g., the most "clean sound" setting), control signals may be generated including instructions to output audio with a highest or higher than a threshold level of clarity (e.g., to output sound with a lowest or lower than a threshold level of distortion, with equal or no amount of boost for different frequencies of the sound, with boosting and/or cutting of select frequencies, etc.) for a given volume and sound source. Responsive to user input to position the adjustment element 310 at the highest setting (e.g., the most "powerful sound" setting), control signals may be generated including instructions to output audio with a highest or higher than a threshold level of boosting of frequencies of the sound. In other examples, other types of sound adjustments may be made via adjustment element 310. For example, sound output may be controlled to vary from "warm" to "crisp" or between other sound quality distinctions. In some examples, the adjustment element 310 may be adjusted to increase or decrease an amount of an effect on sound output (e.g., an amount of distortion, volume level, fade/balance, etc.).

In order to provide feedback regarding manipulation of the user interface, colors associated with different user interface elements may be adjusted based on one or more settings associated with the user interface. For example, each setting of the adjustment element 310 may correspond to an associated color or color gradient. A portion of the adjustment element 310 (e.g., a region of the semicircular arc extending from the beginning of the arc [the left side terminating end] to a current setting position), hereinafter referred to as a color-filled portion of the adjustment element, may thus be filled with the associated color or color gradient corresponding to the current setting position, while a remaining portion of the adjustment element is "greyed out" or otherwise not filled with the color or color gradient corresponding to the current setting (e.g., filled with a grey color or other default color). In an illustrative example, a color gradient of the adjustment element 310 may transition from blue (at a lowest setting, the most "clean sound" according to the example of FIG. 3), to green, to yellow, to orange, and then to red (at a highest setting, the most "powerful sound" according to the example of FIG. 3), in that order. In some examples, the color-filled portion of the adjustment element may only be filled with a single color associated with a current setting of the adjustment element. In other examples, the color-filled portion of the adjustment element may be filled with a gradient of colors indicating the different colors associated with the different settings below a current setting. Using the above-described example color mapping, portions of the adjustment element may be blue near the "clean sound" end of the element, green partway around the element, yellow/orange halfway around the element, etc.

The colors of one or both of the outer circle 302 and inner circle 304 may be adjusted based on the setting of the adjustment element 310 and/or based on the current setting of the respective circles 302 and 304. For example, the inner circle 304 may be filled with a color or color gradient that includes the color associated with a current setting of the adjustment element 310. The gradient and/or hue, saturation, and/or intensity of the fill of the inner circle 304, or other color properties, may change based on a size of the inner circle. For example, a middle of the inner circle 304 may be a dark hue of the color associated with a current setting of the adjustment element 310, and the fill of the inner circle may transition to a lighter hue of the color associated with the current setting of the adjustment element 310 toward an outer circumference of the inner circle.

Figure 5:
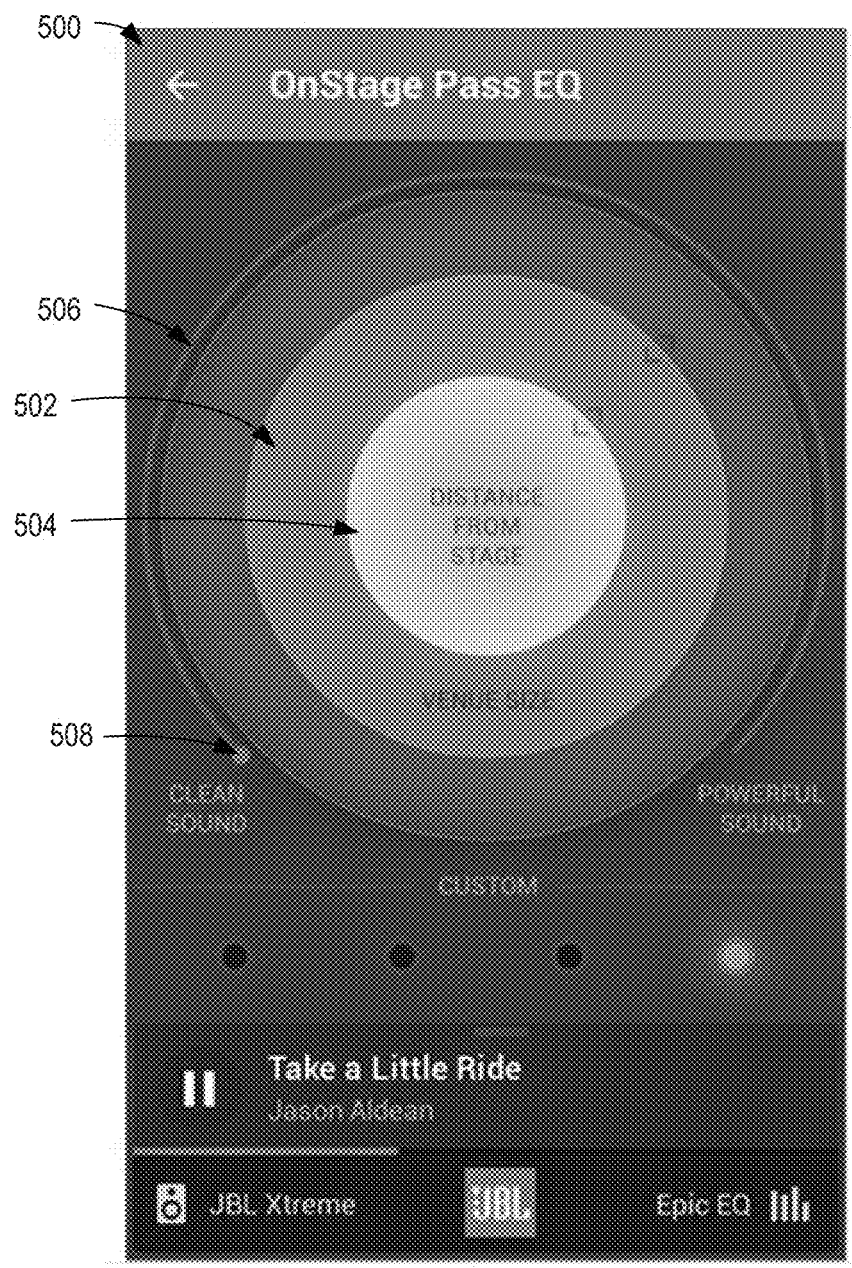
FIGS. 5-9 show example user interfaces for adjusting audio settings and a simulated listening environment, and associated color changes responsive to adjustments, in accordance with one or more embodiments of the present disclosure.

FIGS. 5-9 show example color adjustments corresponding to current settings of elements of a user interface. FIG. 5 shows an example user interface 500 that includes similar elements to those described above with respect to FIG. 3. For example, outer and inner circles 502 and 504 may correspond to outer and inner circles 302 and 304 of FIG. 3, respectively. Sound characteristic adjustment element 506 may correspond to adjustment element 310 of FIG. 3. The description of the above-referenced elements of FIG. 3 may thus apply to the corresponding elements of FIG. 5. The current setting of the adjustment element 506 in FIG. 5 (as shown by a location of selectable element 508 that is movable to change the currently setting of the adjustment element) is at a terminating end associated with "clean sound" setting (e.g., the setting associated with the cleanest sound). This setting of the adjustment element may correspond to an associated color, such as blue. The colored region of the adjustment element 506 may thus be colored blue. Likewise, the inner circle 504 may be filled with a blue gradient.

Figure 6:
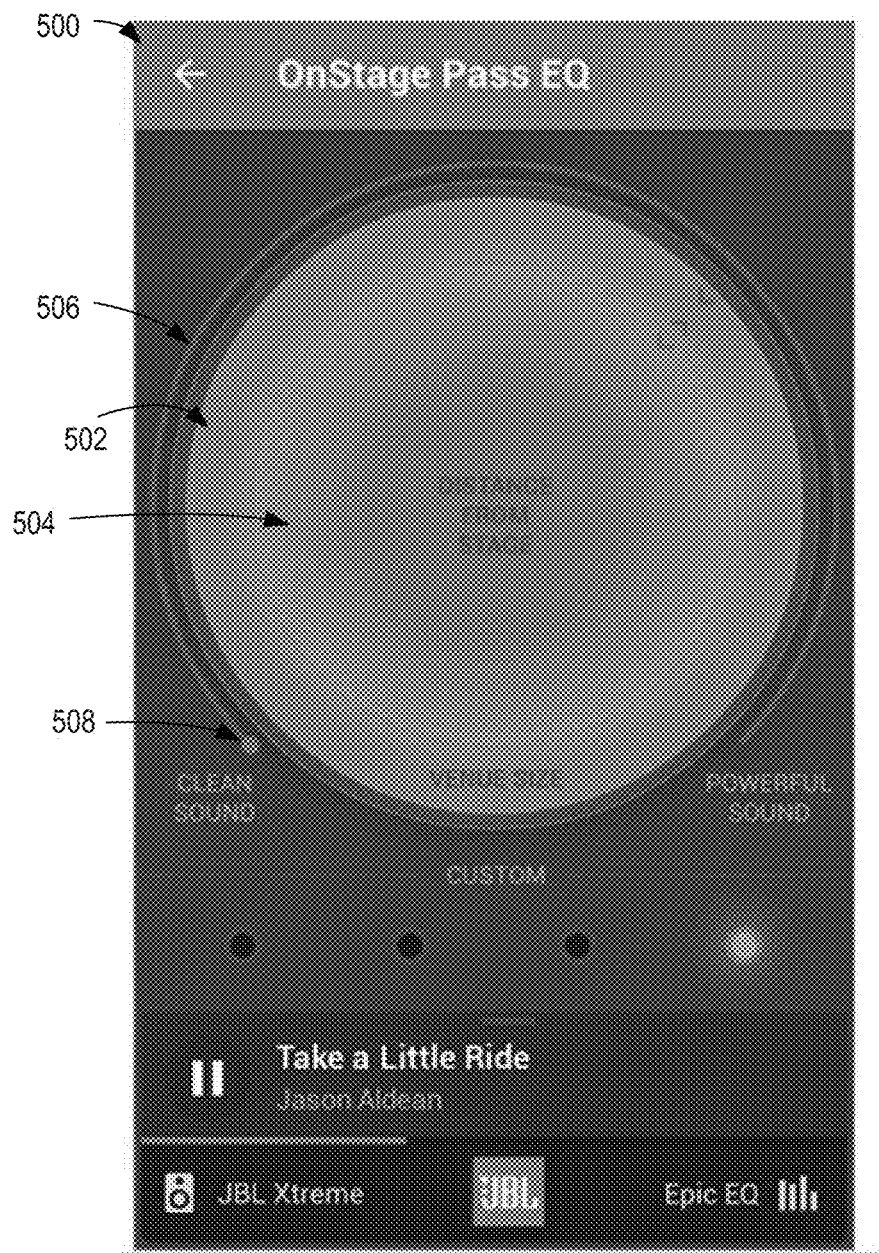

In order to provide feedback regarding changes in size of the inner circle, parameters of the gradient of the inner circle may change based on a current size of the inner circle. For example, in FIG. 5, the inner circle is a medium size, with a central region of the circle including a darker hue of the color associated with the current setting of the adjustable element (e.g., blue) than an outer circumferential region of the circle. FIG. 6 shows an example appearance of the user interface 500 responsive to resizing the inner circle 504 to increase the size of the inner circle. Increasing the size of the inner circle to a large size (e.g., while maintaining the adjustment element 506 at the same setting) may result in an overall darker hue of the color associated with the current setting of the adjustable element (e.g., blue) than was displayed in FIG. 5, when the inner circle was a medium size. For example, increasing the size of the inner circle may increase the amount of the darker hue that is displayed, resulting in an overall increased darkness in hue as the inner circle size increases.

Figure 7:
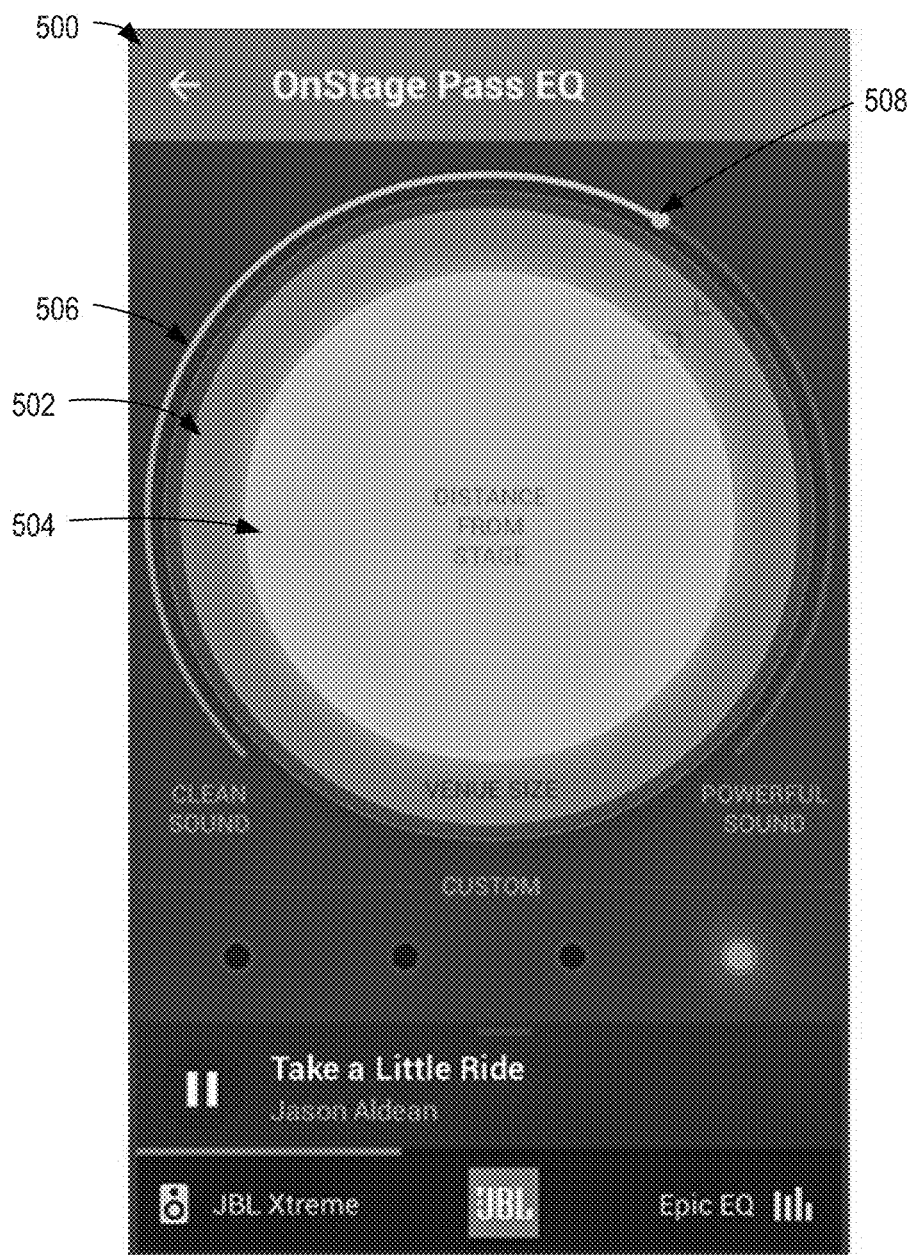
Figure 8:
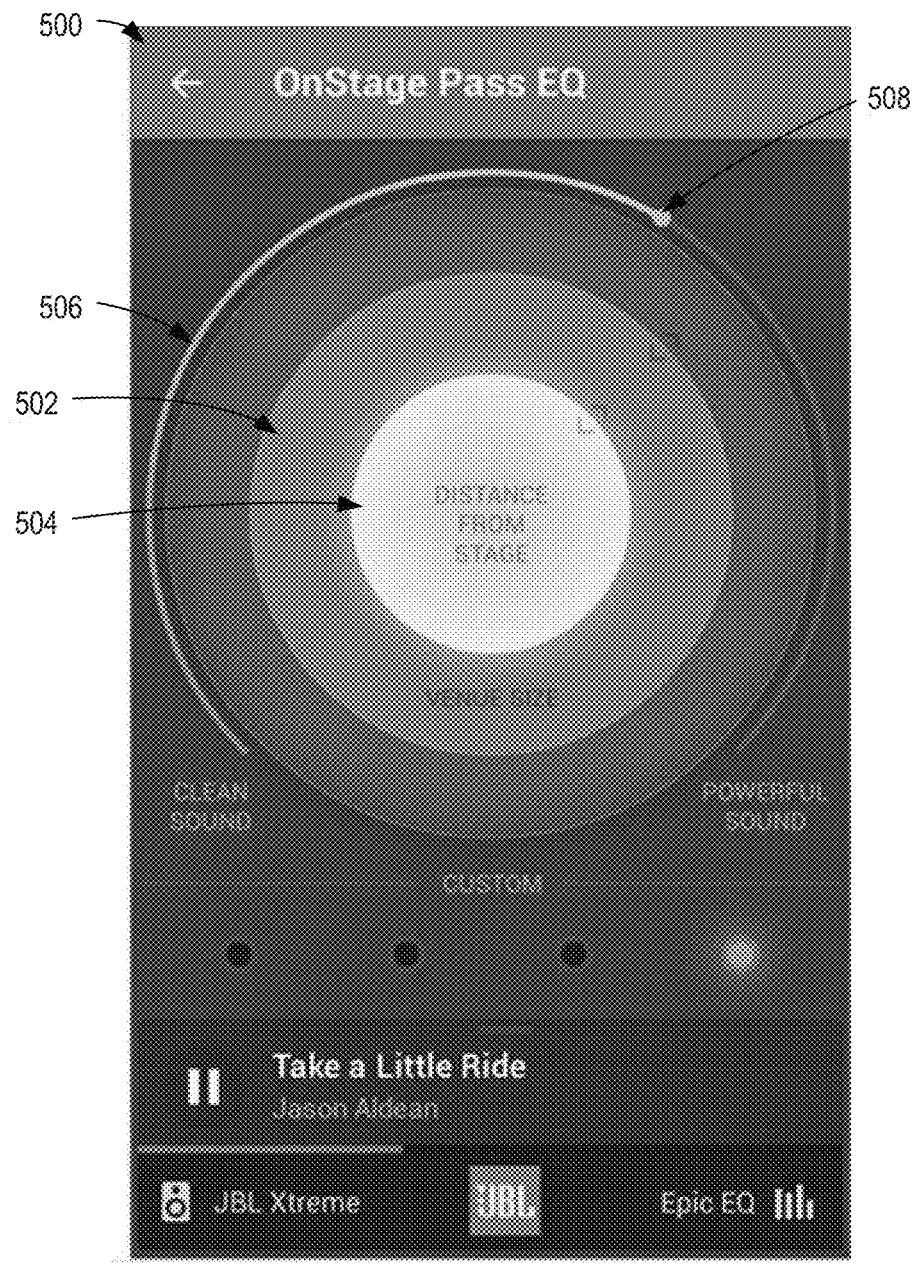

FIG. 7 shows an example appearance of the user interface 500 responsive to changing a setting of the adjustment element 506 (relative to the setting in FIGS. 5 and 6) toward a more powerful sound (e.g., as represented by the position of the selectable element 508. The color associated with the updated/adjusted setting of the adjustment element 506 may be yellow in this example, and the color gradient filling the inner circle 504 may include different hues of yellow. The adjustment element 506 may be displayed with a gradient ranging from blue (in the region of the most "clean sound" settings) to green, then to yellow toward the region of the selectable element 508. FIG. 8 shows an example appearance of the user interface 500 responsive to changing a setting of the inner circle 504 (relative to the setting in FIG. 7) toward a smaller distance from the stage. The color gradient of the inner circle may still include hues of yellow, and may be overall lighter in hue than the fill of a larger inner circle (e.g., an inner circle having the size as displayed in FIG. 7).

Figure 9:
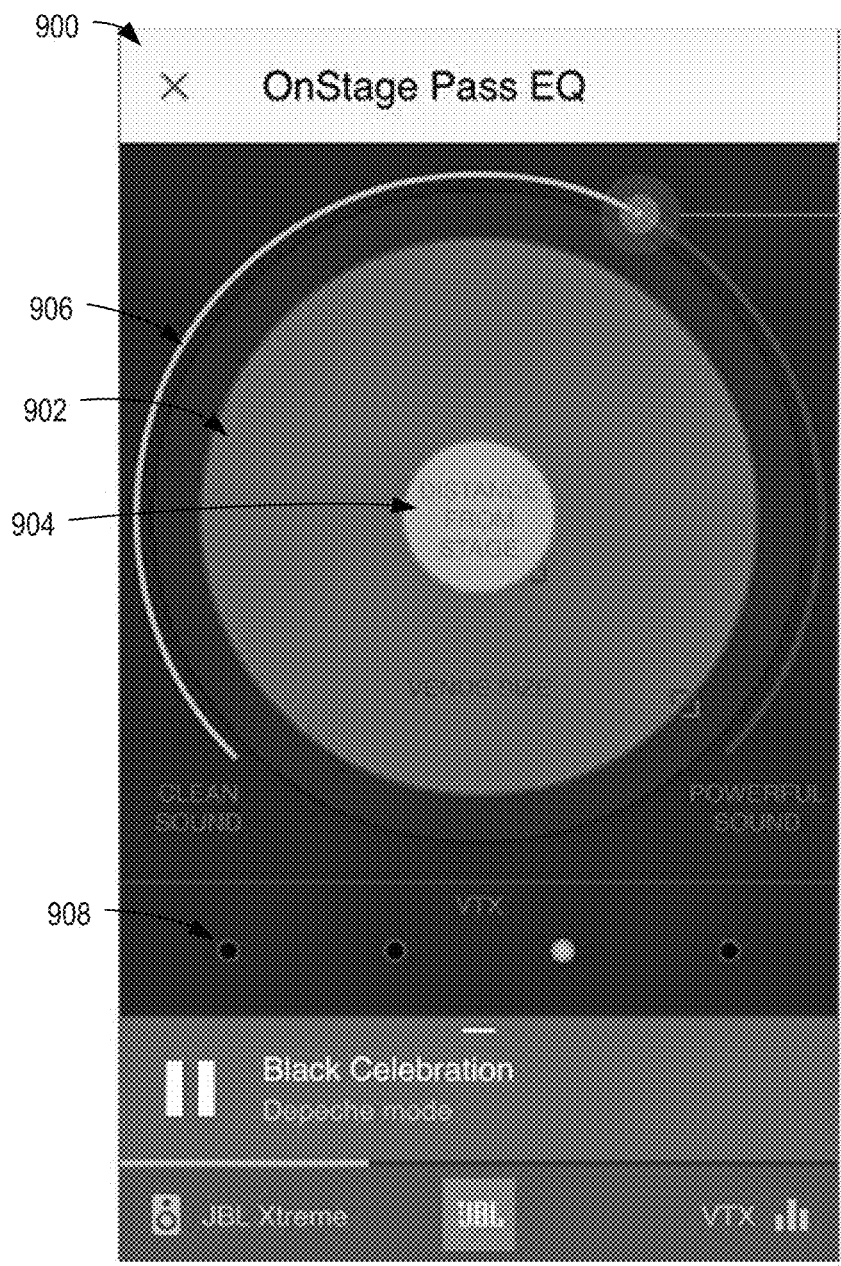

FIG. 9 shows an example user interface 900 that includes similar elements to those described above with respect to FIG. 3. For example, outer and inner circles 902 and 904 may correspond to outer and inner circles 302 and 304 of FIG. 3, respectively. Sound characteristic adjustment element 906 may correspond to adjustment element 310 of FIG. 3 and presets 908 may correspond to preset elements 314 of FIG. 3, to be described in more detail below. The description of the above-referenced elements of FIG. 3 may thus apply to the corresponding elements of FIG. 9. In the example user interface 900, a color of the adjustable element 906 and inner circle 904 may be solid. The color of the adjustable element and inner circle in the example of FIG. 9 may be selected based on a current setting of the adjustable element, a current setting of the inner circle, and/or a currently-selected preset.

Returning to FIG. 3, the colors used in the user interface 300 may be coordinated with interior and/or exterior lights of the vehicle. For example, an interior passenger cabin of the vehicle and/or a trunk of the vehicle may include one or more configurable lights that are adapted to output a range of different colors responsive to control instructions. Such lights may be controlled by input to the user interface 300 in order to cause the lights to emit light having a color that is the same as one or more of the colors of the adjustment element 310 and/or the outer/inner circles 302 and 304. In some examples, one or more of the lights of the vehicle may be adapted to output colors representing a current setting of any one or more controls of the user interfaces described in this disclosure.

The lights of the vehicle may additionally or alternatively be controlled based on other aspects of the user interface, the current sound output, and/or user input. For example, interior and/or exterior lights of the vehicle may be controlled to emit one or more colors associated with or otherwise selected for a feature of a currently-played media item. Such features may include, for example, a genre, song/song title, album, artist, location in playback of a song (e.g., beginning/intro vs. middle vs. end/outro, chorus vs. verse, instrumental vs. vocal, etc.), number of song in a playlist or album (e.g., the colors slowly changing throughout a spectrum while advancing through a playlist or album to indicate how near a currently-played track is to the end or beginning of the album or playlist), a quality of music being played back, etc.

In additional or alternative examples, the interior and/or exterior lights of the vehicle may be controlled to emit one or more colors associated with or otherwise selected for a state or condition of the vehicle, the speaker system, etc. For example, different colors may be associated with a device syncing/pairing state (e.g., a color associated with an in-progress syncing/pairing operation, a color associated with a successful syncing/pairing operation, a color associated with a failed or otherwise unsuccessful syncing/pairing operation, etc.). Such devices may include a mobile device being paired to an in-vehicle computing system, a speaker that is added or removed from a vehicle (e.g., where different colors are emitted to represent removing or adding a speaker, and/or where different colors or positions of lights emitting a selected color are associated with different types of speakers being added or removed and/or different locations of speakers that are removed), and/or another device that is paired to the vehicle. For example, responsive to detecting a rear subwoofer being removed, lights near a rear of the vehicle and/or lights within a trunk of the vehicle may be controlled to emit a selected color of light associated with a speaker being removed and/or associated with a subwoofer. In some examples, removal or movement of a speaker may change operation of the speaker (e.g., a subwoofer may become a full range speaker when removed from a trunk of a vehicle). In such examples, an alert indicating the change in operation of the speaker may be presented on the user interface and/or communicated by emitting light having a color and/or pattern associated with the change in operation of the speaker.

Different colors may be associated with a state of the vehicle, such as a vehicle entry (e.g., responsive to a door open event), vehicle start up (e.g., responsive to a key-on event or other ignition start), vehicle speeds or speed ranges—determined using measurements from an in-vehicle sensor and/or a sensor of a device within the vehicle such as an accelerometer of a vehicle/phone, vehicle warnings (e.g., low fuel/range warnings, temperature warnings, traction warnings, etc.), and/or other vehicle states. Responsive to entering the above-described states, one or more of the lights of the vehicle may be controlled to emit the color(s) associated with the state(s). If the vehicle, speaker system, or other system has entered multiple states, light emission may be based on a priority of the states (e.g., where one or a subset of states "override" other states to be represented by the lights) and/or segmented such that different subsets of lights are controlled to emit different colors associated with the current states (or highest priority states) of the vehicle, speaker system, etc. and/or such that different states are represented by the light outputs at different times (e.g., with highest priority or earliest-entered states being represented first). The subsets of lights may be selected and/or positioned based on the states being represented and/or based on a pre-configured default arrangement. For example, each subset may include a numerical quantity of lights that is selected to evenly distribute available lights amongst the states being represented or to provide more lights in subsets that represent higher priority states. In some examples, each subset of lights may include lights that are positioned in a vehicle near a state that is being represented and/or in a position relative to the driver based on priority—the highest priority state being represented by a subset of lights that are nearest to a driver seat and/or an approximated field of view of a driver.

The colors associated with different settings, output music features, and/or conditions may be automatically selected and/or selected by a user. In some examples, a user may select a color of each, a subset, or all of the lights in the vehicle directly via the user interface (e.g., via a user interface control that identifies the light(s) to be controlled and the color choices for the light(s)).

The above-described light controls may be used in combinations in some examples. For example, a hue of one or more of the lights may be set based on a first condition (e.g., a current setting of a user interface control) and an intensity of one or more of the lights may be set based on a second, different condition (e.g., a quality sound being currently output). As an illustrative, non-limiting example, one or more of the lights may be set to emit red light (e.g., light that is within the wavelength/frequency spectrum associated with red light) responsive to the adjustment element 310 being set to "powerful" sound (e.g., being in a location that is closer along the arc user interface element to the "powerful" setting than the "clean" setting). In such an example, the lights may turn red in real time as the user adjusts the adjustment element 310 via user input. While music is being played back in this example, the lights may dynamically change in intensity based on qualities of the music. For example, the red lights may emit brighter light (e.g., increase intensity) responsive to bass output that is above a threshold (e.g., a period of heavy bass in a song) and output dimmer light (e.g., decrease intensity) responsive to bass output that is below a threshold (e.g., a period of weak or no bass in a song). In the above example, the lights may dynamically and automatically change to output blue light (e.g., light that is within the wavelength/frequency spectrum associated with blue light) responsive to user input to the adjustment element 310 to change the sound setting to "clean" sound (e.g., moving the adjustment element setting to a location that is closer along the arc user interface element to the "clean" setting than the "powerful" setting). The transition between light colors may be direct (e.g., from a color associated with a starting setting directly to a color associated with an ending setting) or gradual (e.g., progressing along a spectrum from the color associated with the starting setting to the color associated with the ending setting). It is to be understood that descriptions relating to changes and/or settings of light colors may additionally or alternatively be applied to changing and/or setting other parameters of the light sources, such as emitting light with different intensities, strobing lights (e.g., flashing lights intermittently and/or changing a frequency of light flashes), emitting patterns of light via one or more light sources, etc.

The user interface 300 may also include one or more preset elements 314. Each of the preset elements may correspond to one or more pre-configured audio settings. In some examples, the preset elements may correspond to a pre-configured setting of concentric circles 302/304 and/or adjustment element 310. For example, selection of one of such preset elements may cause one or more of the user interface elements associated with the distance from the stage, venue size, and/or sound characteristic settings to be automatically adjusted to respective pre-configured settings. In this way, a user may quickly (e.g., via one selection) access favorite configurations of sound parameters.

Figure 10:
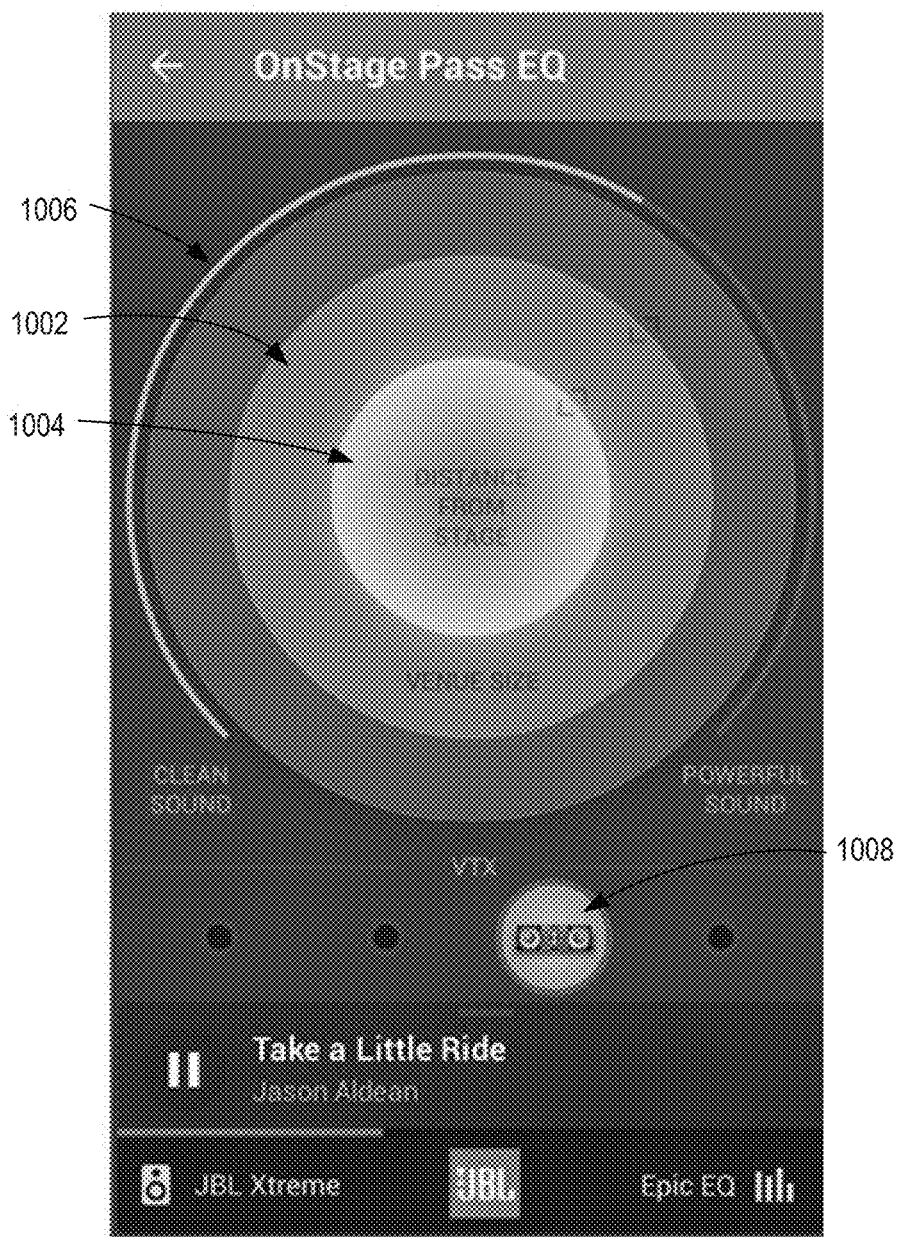
FIGS. 10-15 show example user interfaces for selecting preset speaker models for simulating audio output in accordance with one or more embodiments of the present disclosure.

In other examples, the preset elements may correspond to the simulation of outputting audio via a particular type or model of speaker with the venue and sound options selected via the concentric circles 302/304 and/or the adjustment element 310. Turning briefly to FIG. 10, an example user interface 1000 includes similar elements to those described above with respect to FIG. 3. For example, outer and inner circles 1002 and 1004 may correspond to outer and inner circles 302 and 304 of FIG. 3, respectively. Sound characteristic adjustment element 1006 may correspond to adjustment element 310 of FIG. 3. The description of the above-referenced elements of FIG. 3 may thus apply to the corresponding elements of FIG. 10.

Figure 11:
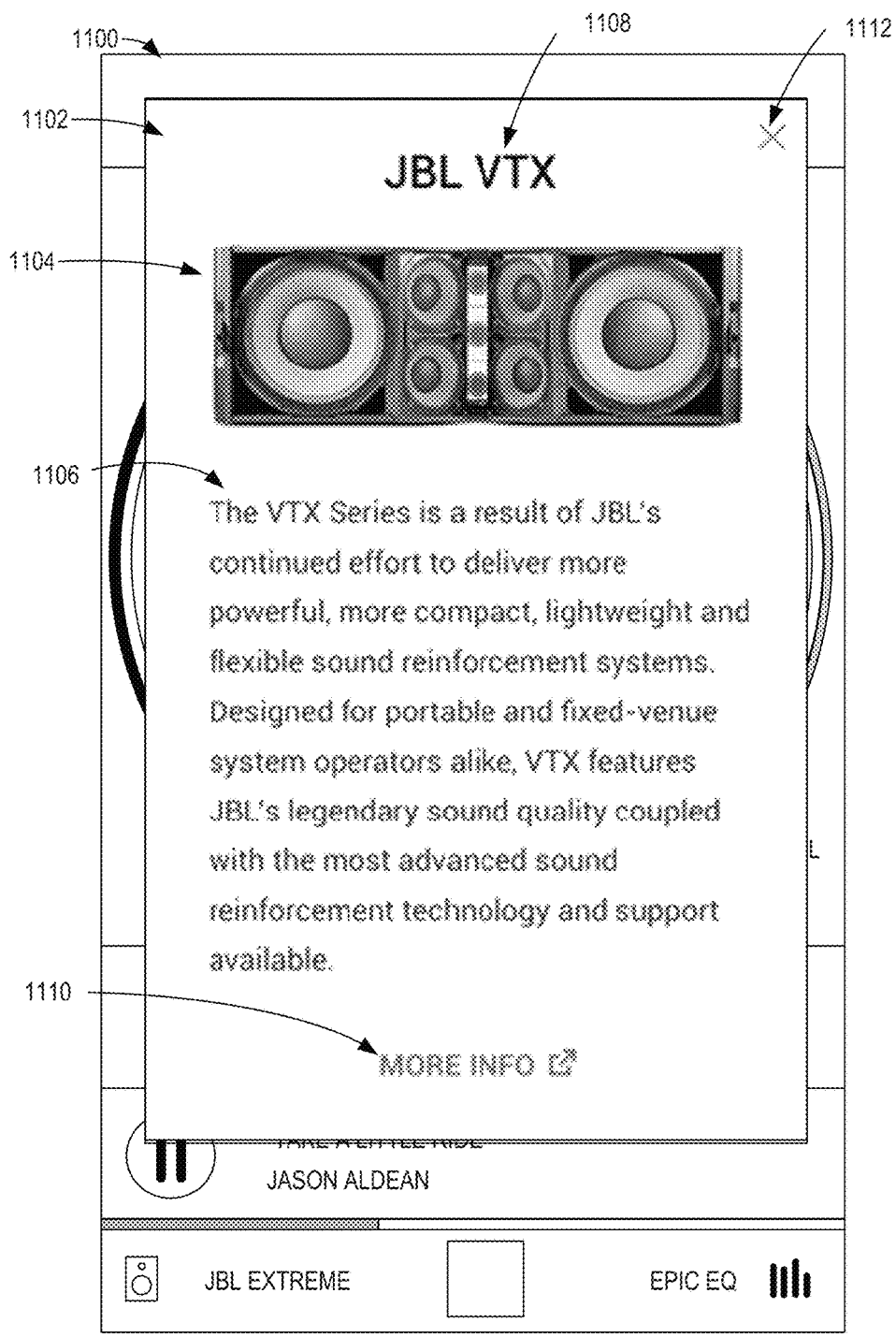

FIG. 10 also shows an example preset element 1008 that includes a graphical identifier of an example speaker model that may be simulated responsive to selection of the preset element. FIGS. 11-14 show example speaker models that may be simulated responsive to selection of an associated preset element. For example, FIG. 11 shows an example user interface 1100 including a pop-up informational window 1102 identifying a speaker model that may be simulated. Informational window 1102 may be presented responsive to receiving selection of a preset element associated with that speaker model (e.g., preset element 1008 of FIG. 10) and/or responsive to receiving other input to the preset element associated with that speaker model (e.g., a long press, a swipe starting at the associated preset element, etc.). In the informational window 1102, an image 1104 of the associated speaker (e.g., a larger version of an image used as an icon for an associated preset element, such as preset element 1008 of FIG. 10) may be presented, along with text 1106 describing the associated speaker. An identifier 1108 of the associated speaker (e.g., the speaker's model name, brand, and/or other identifier) may be presented at a top region or other prominent location of the informational window. A link 1110 to access more information regarding the associated speaker (e.g., a link to an external webpage, speaker manual document, or other information source) may be displayed in the informational window. Selection of the link 1110 may result in a browser application, document reader application, and/or other application to be launched to present additional information regarding the associated speaker. In some examples, the link may be selected to enable a user to purchase the associated speaker and/or another speaker (e.g., a speaker to expand or upgrade a current speaker configuration being used). For example, selection of the link may direct the user (e.g., open a web page via a browser application) to a store page for purchasing the associated and/or other speaker. The informational window may be closed by selecting the close element 1112, by tapping anywhere in the window aside from the link 1110, by tapping outside of the window, and/or by performing another dismissal input.

Figure 12:
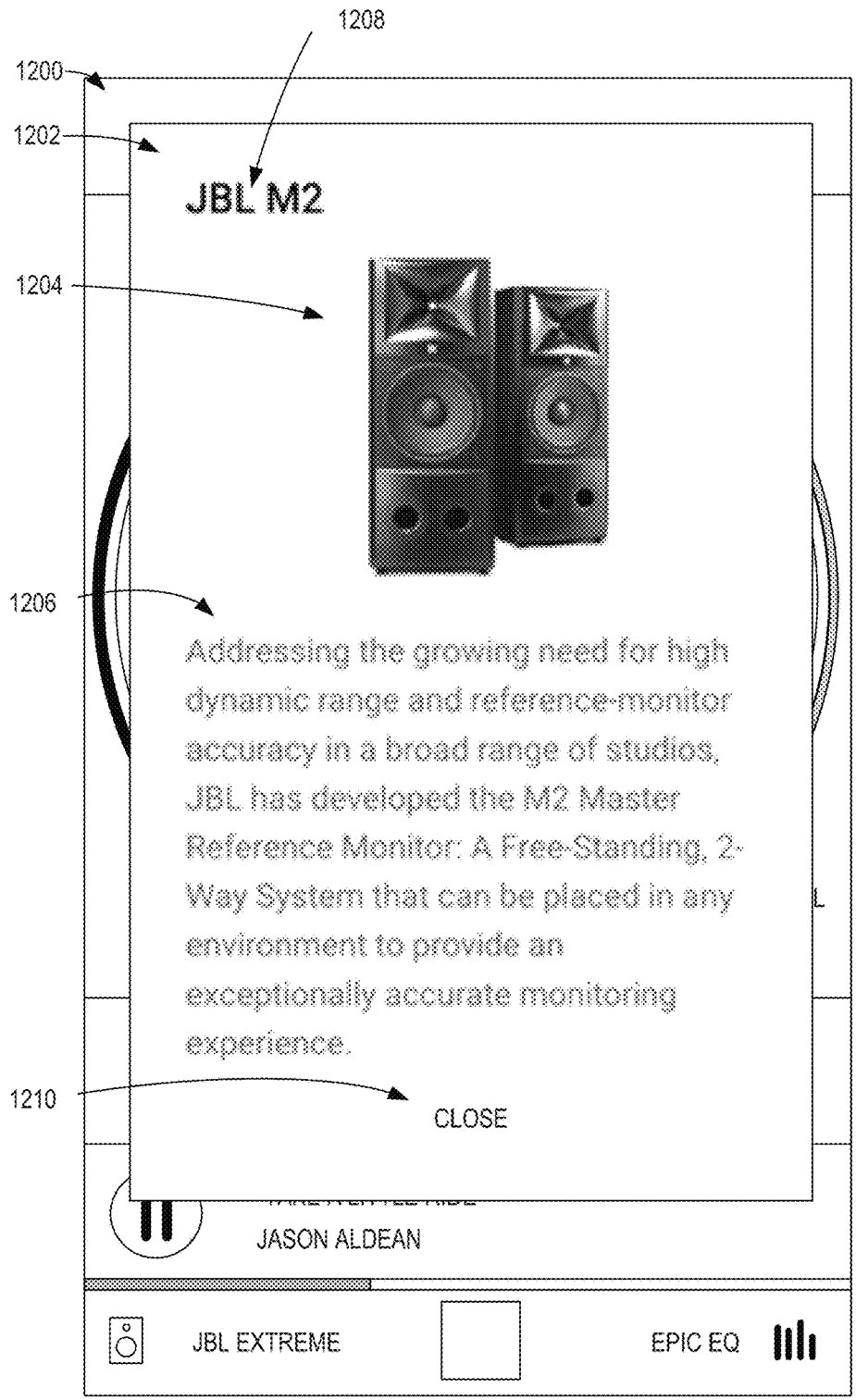

FIG. 12 shows an example user interface 1200 including a pop-up informational window 1202 identifying a speaker model that may be simulated. Informational window 1202 may be presented responsive to one or more of the selection inputs described above with respect to FIG. 11. The informational window 1202 may include similar elements to those described above with respect to FIG. 11, and description presented above with respect to FIG. 11 applies to the correspondingly-named elements of FIG. 12. For example, the informational window 1202 of FIG. 12 includes an image 1204 of the associated speaker may be presented, along with text 1206 describing the associated speaker. An identifier 1208 of the associated speaker may be presented at a top region or other prominent location of the informational window. The informational window 1202 may include a close element 1210, which, when selected, may cause the informational window to be closed. The informational window 1202 may additionally or alternatively be closed by tapping anywhere in the window, by tapping outside of the window, and/or by performing another dismissal input.

Figure 13:

FIG. 13 shows an example user interface 1300 including a pop-up informational window 1302 identifying a speaker model that may be simulated. Informational window 1302 may be presented responsive to one or more of the selection inputs described above with respect to FIGS. 11 and 12. The informational window 1302 may include similar elements to those described above with respect to FIG. 12, and description presented above with respect to FIG. 12 applies to the correspondingly-named elements of FIG. 13. For example, the informational window 1302 of FIG. 13 includes an image 1304 of the associated speaker may be presented, along with text 1306 describing the associated speaker, an identifier 1308 of the associated speaker, and a close element 1310.

Figure 14:
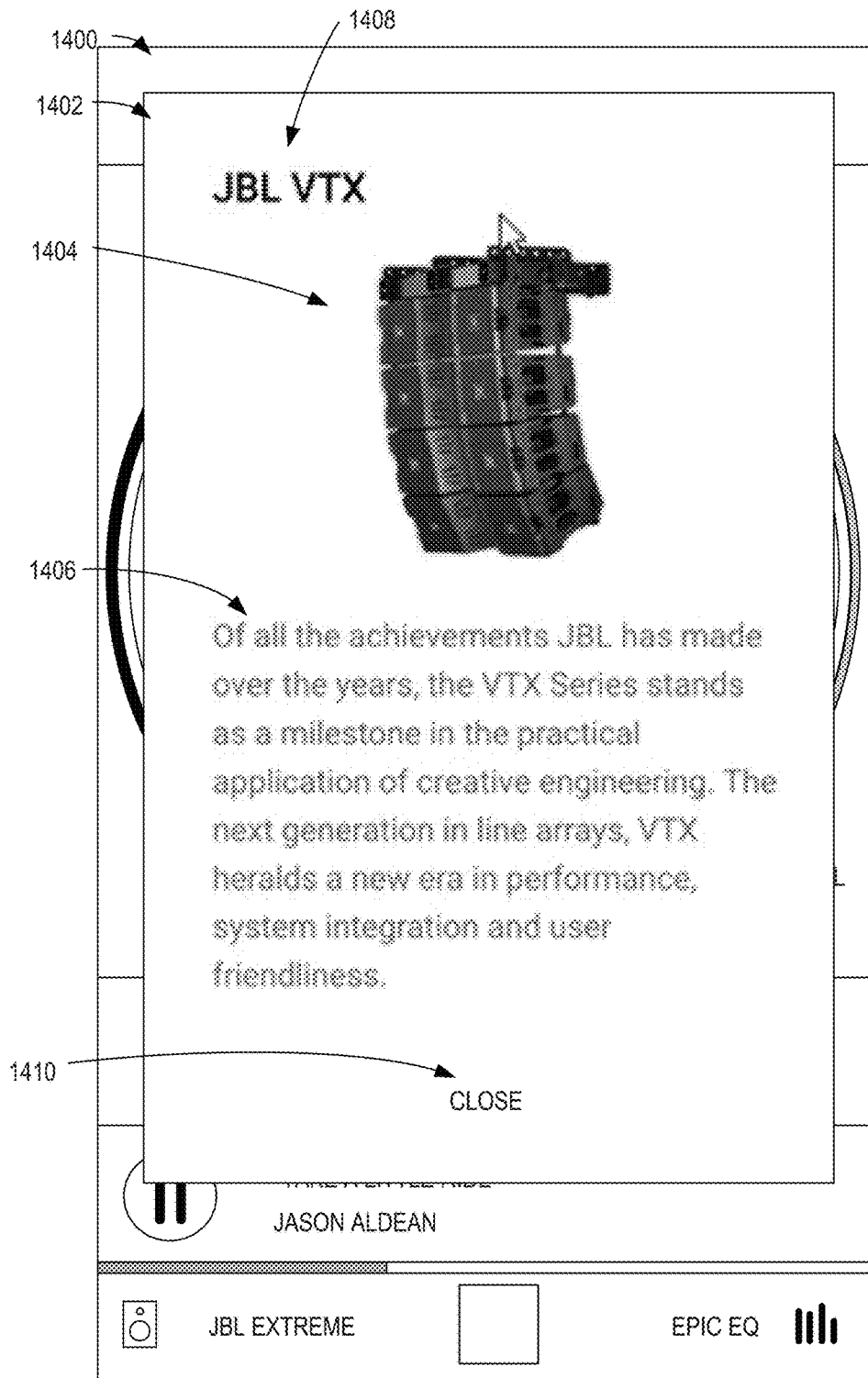

FIG. 14 shows an example user interface 1400 including a pop-up informational window 1402 identifying a speaker model that may be simulated. Informational window 1402 may be presented responsive to one or more of the selection inputs described above with respect to FIGS. 11-13. The informational window 1402 may include similar elements to those described above with respect to FIG. 12, and description presented above with respect to FIG. 12 applies to the correspondingly-named elements of FIG. 14. For example, the informational window 1402 of FIG. 14 includes an image 1404 of the associated speaker may be presented, along with text 1406 describing the associated speaker, an identifier 1408 of the associated speaker, and a close element 1410.

Figure 15:
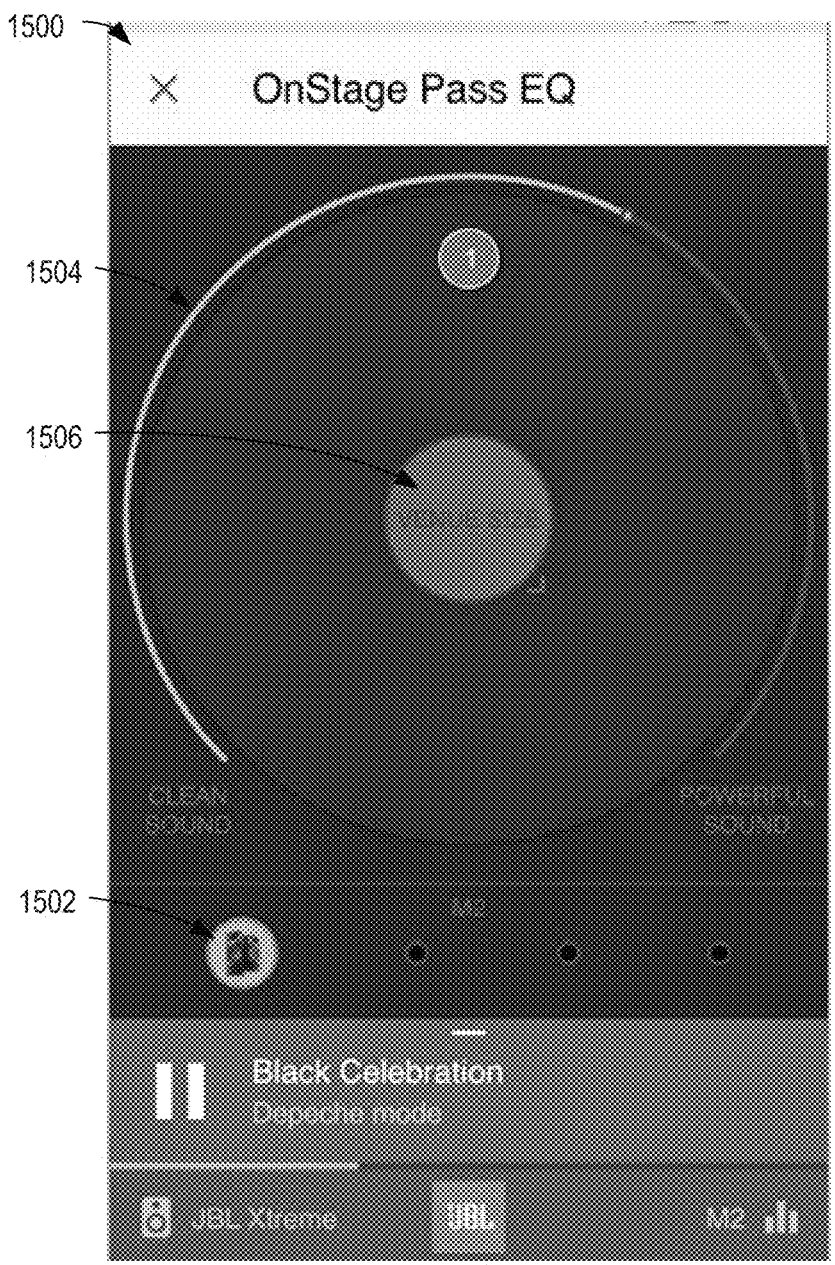

FIG. 15 shows an example user interface 1500 including a preset element 1502 with an image icon corresponding to the speaker associated with informational window 1202 of FIG. 12. Accordingly, the informational window 1202 of FIG. 12 may be presented responsive to selection of preset element 1502 of FIG. 15. User interface 1500 includes similar elements to those described above with respect to FIGS. 3 and 10, including an adjustment element 1504 and a venue size adjustment circle 1506. The example of FIG. 15 does not include a distance from stage adjustment circle, and thus illustrates an example modification of the user interfaces shown in FIGS. 3 and 10 to include different and/or fewer selectable elements.

Returning to FIG. 3, the speaker models and/or types available for selection via the preset elements may be previously set by a user. Although only four preset elements are shown in the illustrated example, any number of presets may be included in user interface 300. The presets may be any combination of the types of presets described above, and/or may correspond to other audio settings that are automatically adjusted responsive to the single selection of a respective preset element.

Information regarding a currently-playing or last played media item may be presented in a media control panel 316. The media control panel may include text information, such as a song or track title and/or number, album title, artist name, and/or other identifying information. Album art and/or other image information related to the current or last played media item may also be displayed in the media control panel. In the illustrated example, the media control panel includes a play/pause control item 318, which may be selectable to toggle between playing and pausing a media item. Additional or alternative controls may be displayed in the media control panel 316, including track navigation controls (e.g., skip track, return to previous track, etc.), volume controls, playback type controls (e.g., shuffle, repeat, repeat playlist/album, etc.), and/or other media item controls.

Figure 16:
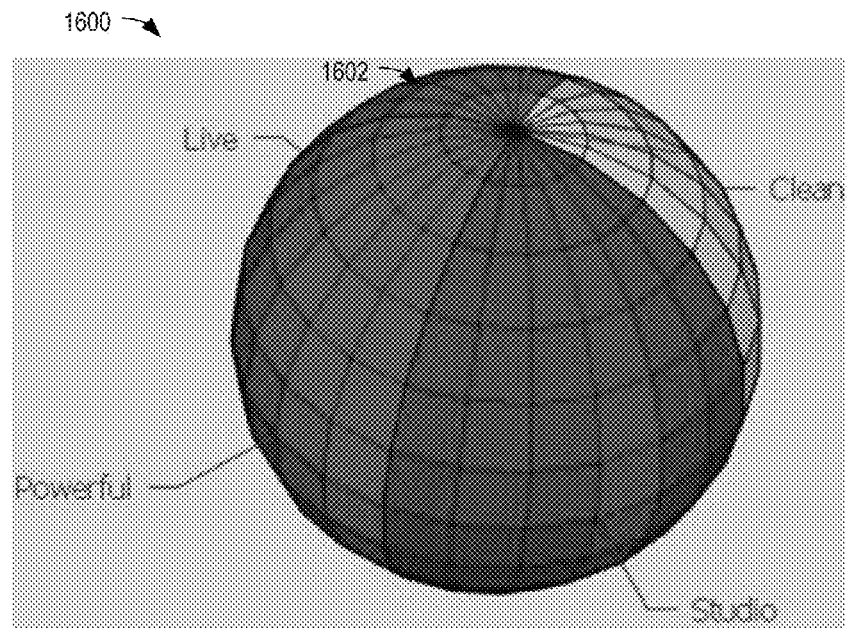
FIGS. 16 and 17 show example user interfaces for selecting different qualities of audio output in accordance with one or more embodiments of the present disclosure.

FIG. 16 shows an example portion of a user interface 1600 that includes an interactive element 1602 for adjusting one or more characteristics of sound output. User interface 1600 may be presented on a display of a computing device included in or coupled to an audio system. For example, user interface 1600 may be presented on a display of in-vehicle computing system 109 of FIG. 1, mobile device 128 of FIG. 1, and/or a display associated with any of the computing devices described in this disclosure. In the illustrated example, input may be provided to rotate and/or adjust an orientation of the interactive element 1602 (in the illustrated example, the element appears as a sphere or spherical shape, while in other examples the element may take on any two- or three-dimensional shape) in order to access different regions of the element. Each region of the element may be associated with a different characteristic of sound (e.g., "Live," "Clean," "Powerful," "Studio" in the illustrated example). Within each region, different selectable areas may correspond to different relative strengths or other characteristics of the type of sound associated with the region. For example, selectable areas near the border of two regions may correspond to sound output that is a hybrid of the types of sound associated with the two bordering regions. Selectable areas near a center of a region may correspond to sound output that is a strongest representation of the type of sound associated with that region. Selectable areas near a top or bottom of the interactive element 1602 may be a hybrid of all of the types of sound, with a focus on the type of sound associated with the region in which the selectable area is located.

Figure 17:
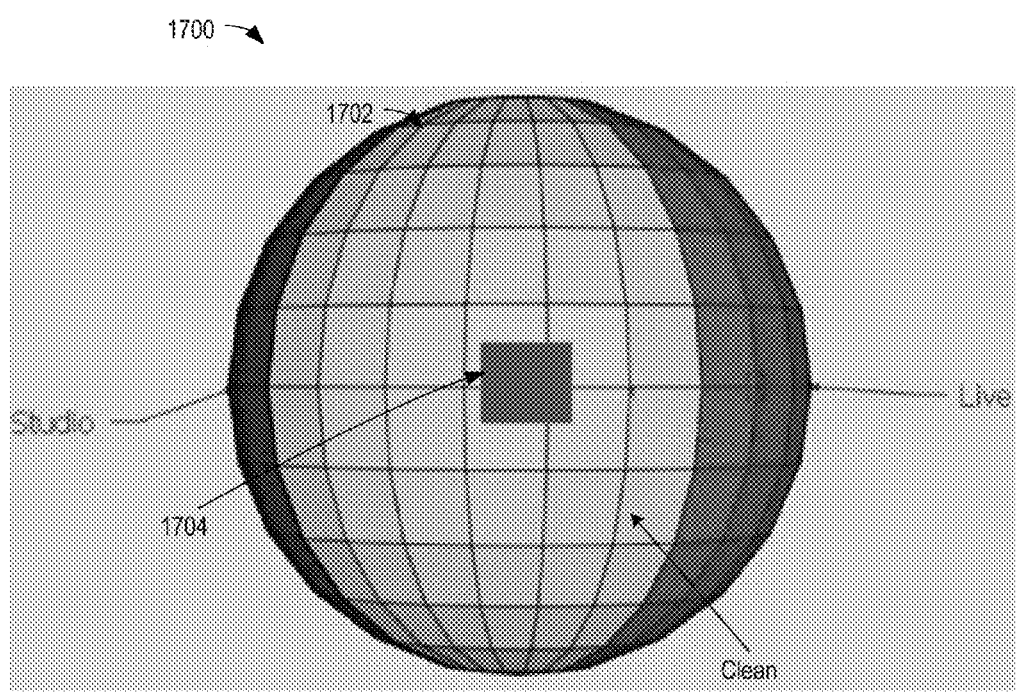

FIG. 17 shows an example portion of a user interface 1700 that includes an interactive element 1702 for adjusting one or more characteristics of sound output. User interface 1700 may be presented on a display of a computing device included in or coupled to an audio system. For example, user interface 1700 may be presented on a display of in-vehicle computing system 109 of FIG. 1, mobile device 128 of FIG. 1, and/or a display associated with any of the computing devices described in this disclosure. Interactive element 1702 may be the same or similar to interactive element 1602 of FIG. 16. Accordingly, the disclosure above regarding interactive element 1602 of FIG. 16 also applies to interactive element 1702 of FIG. 17.

Interactive element 1702 also includes an interactive icon 1704. In the illustrated view, interactive icon 1704 is positioned in an approximately central region of the interactive element 1702. In some examples, the interactive icon is locked to a position relative to the user interface 1700 as a whole. In such examples, the interactive icon 1704 may remain in the same position relative to the user interface 1700, even as the interactive element 1702 is rotated or otherwise oriented differently. In other examples, the interactive icon is locked to a position relative to the interactive element 1702. In such examples, the interactive icon xx may remain in the same position (e.g., at a location within the "clean sound" region of the interactive element in the illustrated example) on the interactive element 1702 as the interactive element is rotated and/or otherwise oriented differently. For example, responsive to rotating the interactive element to the left by an amount that moves the "clean sound" region largely out of view, the interactive icon may be moved with the interactive element by an amount that also leaves the interactive icon out of view.

The interactive icon 1704 may be manipulated to perform an adjustment to the sound output. For example, the interactive icon 1704 may be resized (e.g., via a resizing gesture, such as a pinch and/or zoom gesture) in order to control a volume of the sound output. In such an example, input to the interactive icon 1704 that increases the size of the icon may cause the computing device controlling the user interface to send a control instruction (or otherwise cause a control instruction to be sent) to one or more speakers coupled to the computing device (e.g., one or more vehicle speakers). The control instruction may include instructions to increase a volume of sound output by the one or more speakers. The instructions may provide an output volume that is directly representative of a setting of the volume control (e.g., where the volume is set to a level indicated by the user) and/or an output volume that is further adjusted based on a state of the vehicle (e.g., a speed of the vehicle, a level of ambient noise in the vehicle, etc.). For example, responsive to a user changing a volume to a middle level (e.g., a level 5 on a 1 to 10 scale of volume settings), an audio processor may analyze an accelerometer in the vehicle and/or a connected device (e.g., a mobile phone) to determine an adjustment factor to apply to the user input volume level. In such an example, the user input volume level may be adjusted upward (e.g., increased) if the speed of the vehicle is above a threshold (e.g., if the vehicle is moving or is moving above a certain speed), and the user input volume level may be adjusted downward (e.g., decreased) if the speed of the vehicle is below a threshold (e.g., if the vehicle is stopped or otherwise not moving, or is moving below a certain speed). In other examples, the interactive icon 1704 may be otherwise manipulated (e.g., via a gesture or other input to change a size, shape, orientation, color, or other appearance feature) in order to make corresponding adjustments (e.g., including any of the adjustments described in this disclosure) to the sound output by one or more speakers coupled to the computing device associated with the user interface. In additional or alternative examples, the interactive icon 1704 may be selected to engage or disengage a particular mode or preset associated with the sound output by the one or more speakers. For example, the selection of the interactive icon may change the number and/or types of sound characteristics that are able to be selected via the interactive element 1702, change a color scheme of the interactive element and/or lights within a passenger cabin of a vehicle, change an appearance of the interactive element and/or other features of the user interface, and/or cause an automatic selection of a particular region on the interactive element (e.g., to cause the sound to be output according to the sound characteristics associated with and/or assigned to selected region of the interactive element).

Figure 18:
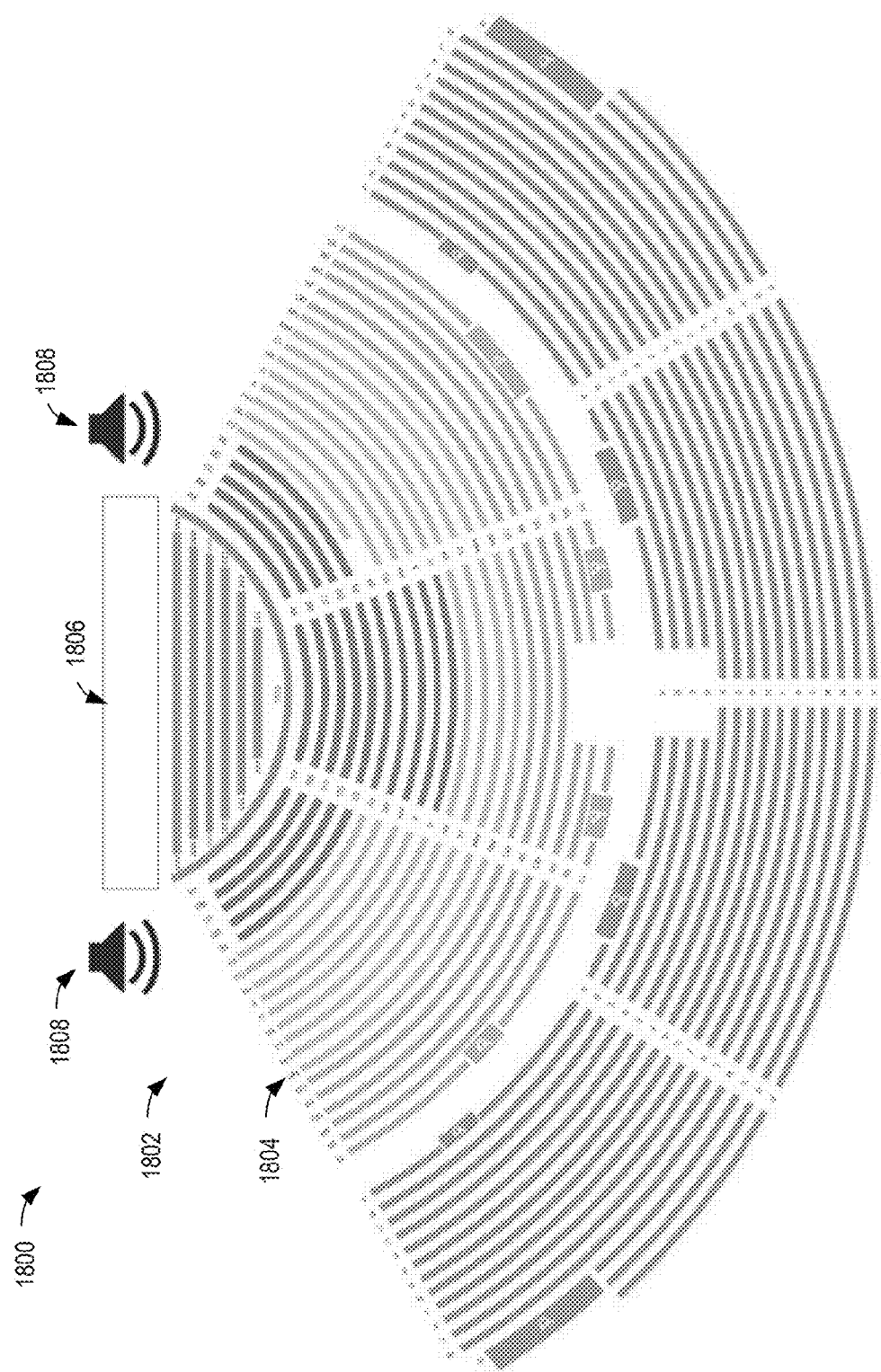
FIGS. 18-21 show example user interfaces for adjusting a simulated listening environment for output audio in accordance with one or more embodiments of the present disclosure.

FIG. 18 shows an example portion of a user interface 1800 that includes interactive element 1802 for adjusting one or more characteristics of sound output. User interface 1800 may be presented on a display of a computing device included in or coupled to an audio system. For example, user interface 1800 may be presented on a display of in-vehicle computing system 109 of FIG. 1, mobile device 128 of FIG. 1, and/or a display associated with any of the computing devices described in this disclosure. Interactive element 1802 includes a geometric representation of a venue, including a seating area 1804, a stage 1806, and speakers 1808. In some examples, interactive element 1802 may geometrically represent a generic or default venue, such as the venue illustrated in FIG. 18. In additional or alternative examples, interactive element 1802 may geometrically represent a venue selected by a user. In such examples, the user interface may provide a user interface element or other selection mechanism to receive selection of a type of venue (e.g., indicating a venue size and/or layout, such as intimate/club [small], concert hall/ballroom/theatre/auditorium [medium], and arena/outdoor venue/amphitheater [large]) and/or a venue modeled after a particular real-world venue (e.g., The 100 Club, The Troubadour, The Tabernacle, Carnegie Hall, Madison Square Garden, the Gorge Amphitheater). The user interface 1800 may additionally or alternatively provide controls for adjusting a layout of a selected or default venue (e.g., changing the number of seats, rows, or row layouts, changing a position of a stage, changing a location, number, and/or type of one or more speakers in the venue, etc.). In some examples, the user interface 1800 may provide controls for a venue builder, including controls for generating a custom venue layout from a blank or starter layout. The user interface may include one or more controls that are selectable to store a created and/or modified venue locally or on a network storage device for later retrieval and/or for sharing with other users.

Once a venue is created and/or selected, a control signal may be sent to speakers that are controlled via the user interface 1800. The control signal may include instructions to adjust one or more audio parameters for sound output by the speakers in order to simulate sound that is output in the created and/or selected venue. The seating area 1804 portion of interactive element 1802 may include one or more selectable elements for specifying a particular location, relative to stage 1806 and/or another sound source, within the created/selected venue from which sound is to be perceived (e.g., a simulated listening location). Each selectable region may be associated with a different simulated listening location within the simulated listening environment (e.g., the created/selected venue). Responsive to selection of a region of the seating area, the sound output by the speakers may be adjusted to simulate the sound as perceived in the created/selected venue while seated in the selected region.

Figure 19:
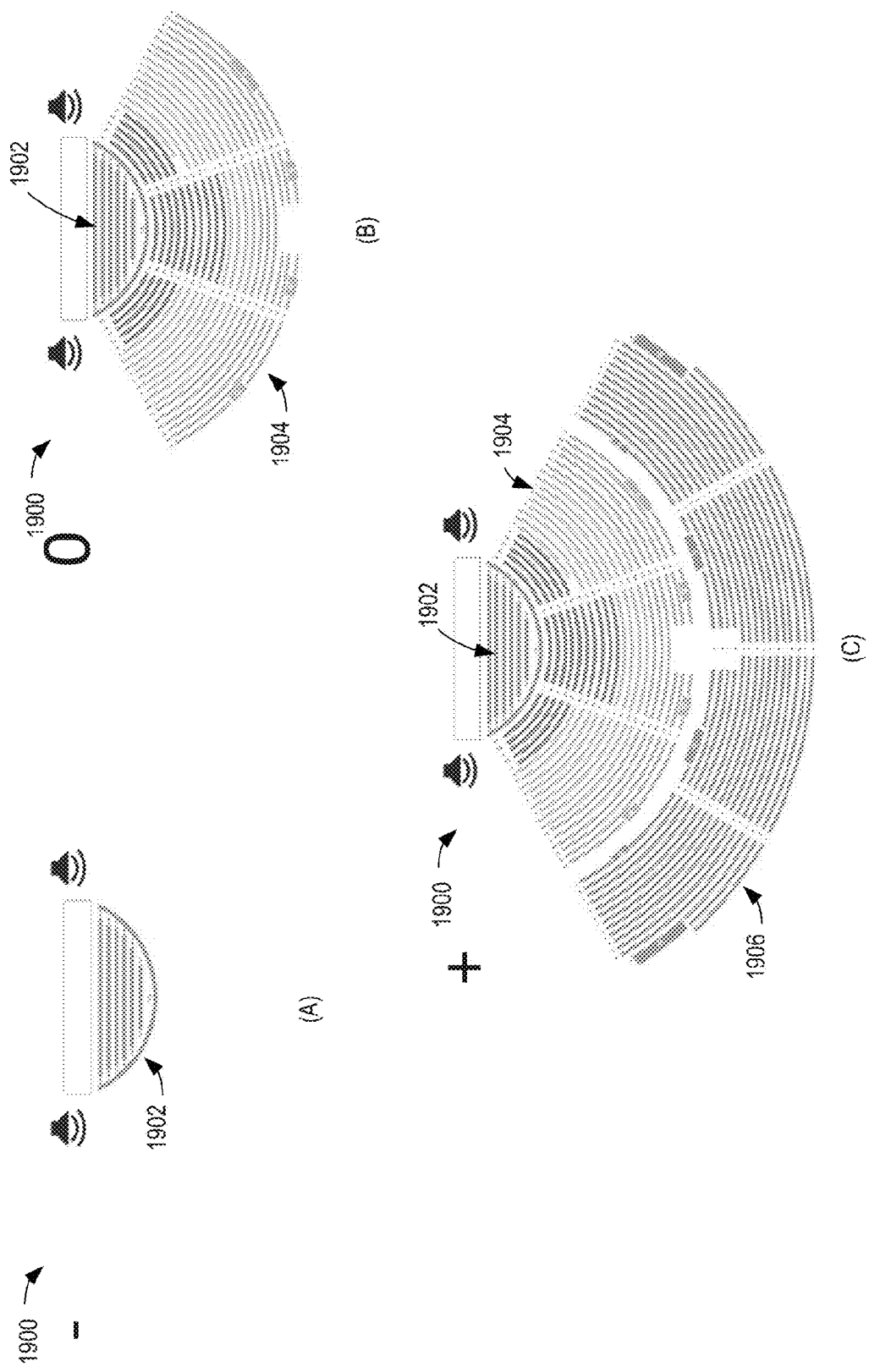

The user interface 1800 may provide for varying levels of precision and/or granularity with regards to selectable regions of the seating area 1804 of the selected venue. For example, as shown in FIG. 19, a user interface 1900 includes selectable sections of seating such as a front section 1902 (in example view A of user interface 1900), a middle section 1904 (in example view B of user interface 1900), and a rear section 1906 (in example view C of user interface 1900) that may be selected to simulate sound as perceived in the respective sections. In some examples, sections having a greater distance from a stage than a selected section may be removed from display (e.g., not displayed) or de-emphasized (e.g., displayed in a lighter color, shading, or otherwise displayed differently relative to other sections of the venue). A section that is farther away from the stage than the selected section may be redisplayed and/or re-emphasized (e.g., displayed with a similar color, shading, or otherwise displayed similarly to other sections of the venue) responsive to selecting that section or a section that is farther from the stage than that section.

Figure 20:
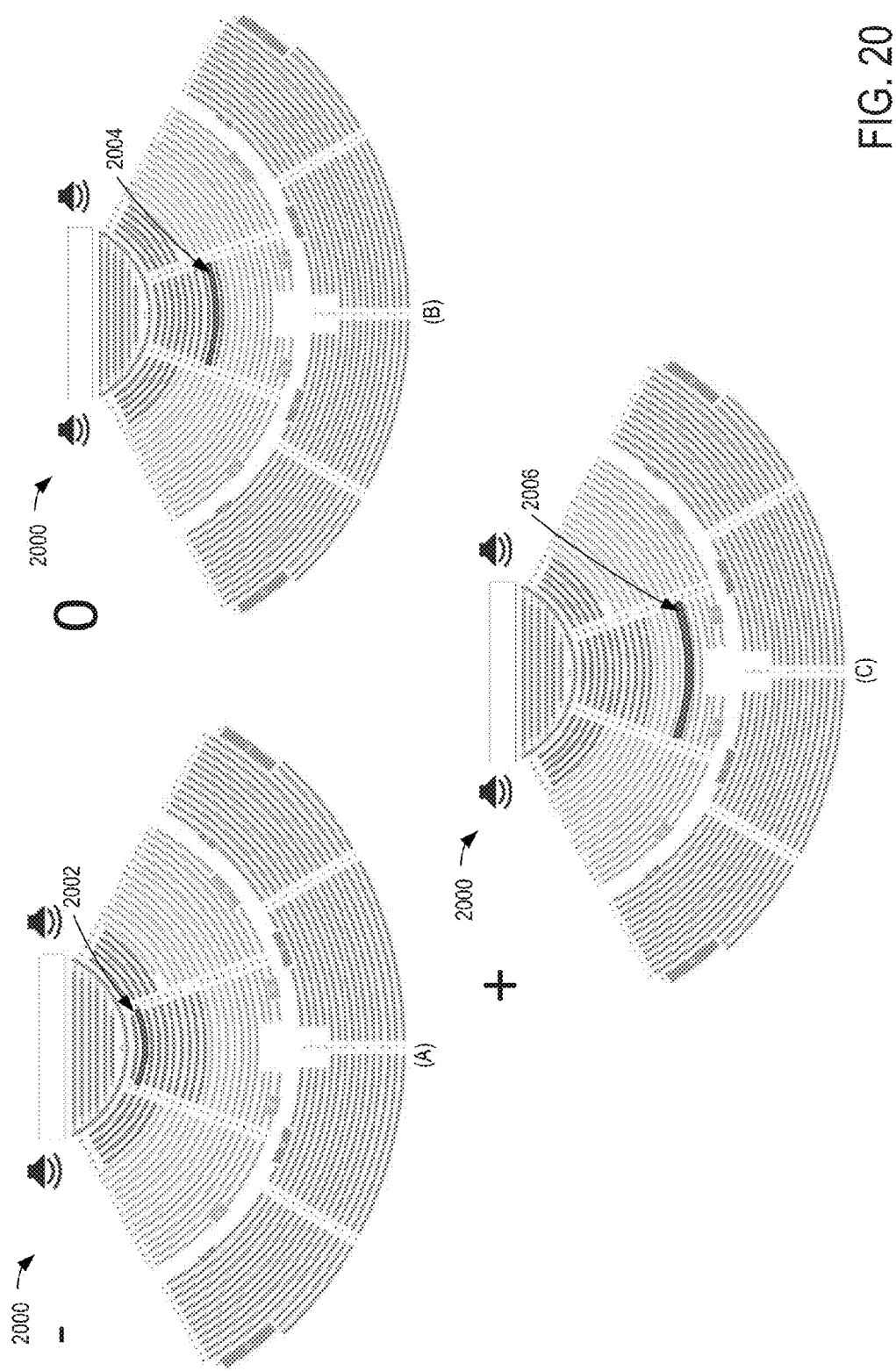

As illustrated in FIG. 20, particular rows within a section of seating may be selectable to simulate sound as perceived from the respective rows. FIG. 20 shows example portions of a user interface 2000 responsive to selections of different rows. A selected row may be highlighted or otherwise displayed differently than other rows in the venue. For example, in example view A, a row 2002 may be selected as a location within a venue from which sound is perceived. In example view B, a row 2004, which is farther from a stage than row 2002, may be selected as a location within a venue from which sound is perceived. In example view B, a row 2006, which is farther from a stage than rows 2002 and 2004, may be selected as a location within a venue from which sound is perceived.

Figure 21:
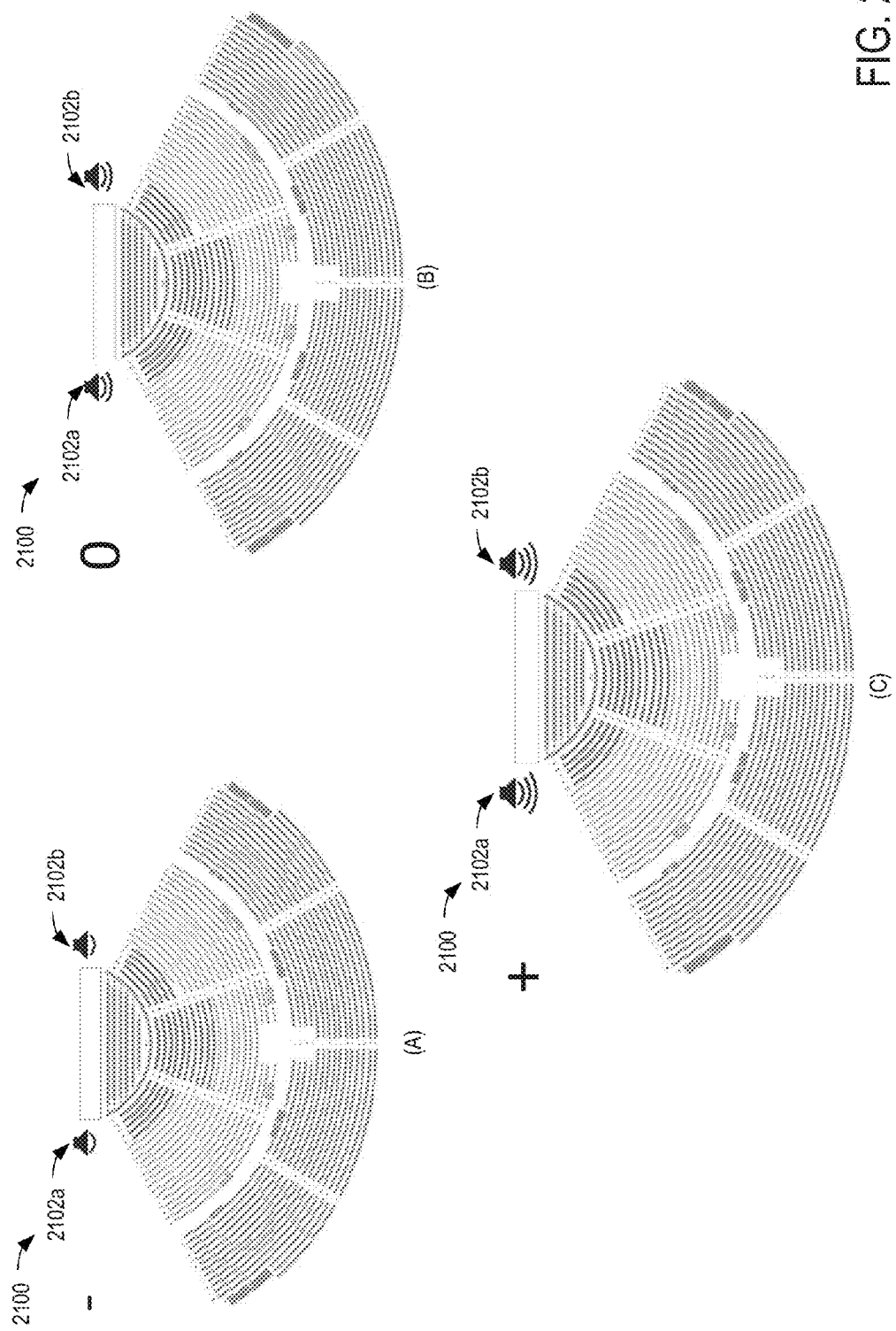

A volume level of sound output may be manipulated using the user interfaces described above. For example, as shown in FIG. 21, an example user interface 2100 may include volume indicators 2102*a* and 2102*b* that provide feedback regarding a current volume level (e.g., where additional sound lines are provided as the volume increases, as shown in views A, B, and C). In some examples, a single volume indicator may be displayed in a user interface, representing an overall sound output by a sound system (e.g., a sound system of a vehicle). In additional or alternative examples, a volume indicator may be displayed for each virtual speaker (e.g., simulated sound source) or real speaker being controlled by the user interface, such that each volume indicator represents the volume level of a different associated (virtual or real) speaker. The user interface may provide one or more discreet controls for adjusting a volume of the speakers in some examples. In other examples, the user interface may receive a volume adjustment gesture or other input and generate a control signal including instructions to adjust the volume of one or more speakers as requested by the received input. For example, a rotating gesture (e.g., simulating rotating a virtual knob positioned on the display that is presenting the user interface) or sliding gesture (e.g., simulating pushing or pulling a virtual slider positioned on the display) may be received to instigate a volume changing operation. In such examples, the virtual knob or slider (e.g., a virtual element representing a volume control) may not be displayed, or may not be displayed until a user performs the associated gesture. The rotating or sliding gesture may be performed above the display (e.g., as a hover gesture) or on the display (e.g., as a touch gesture) that is presenting the user interface.

Figure 22:
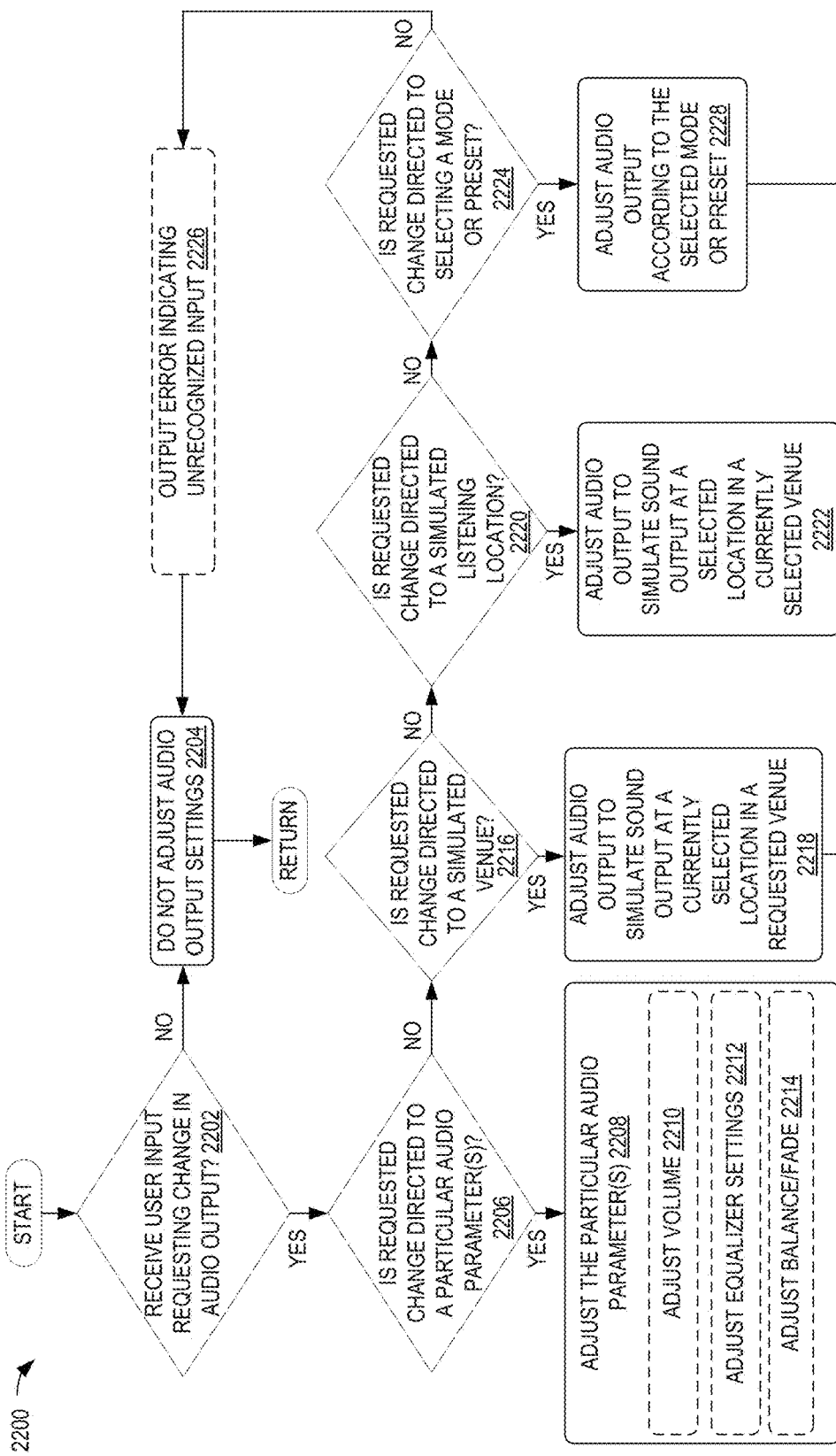
FIGS. 22 and 23 are flow charts of example methods of adjusting audio output responsive to user input in accordance with one or more embodiments of the present disclosure.

FIG. 22 is a flow chart of an example method 2200 for adjusting audio output using a user interface of a computing device. For example, method 2200 may be performed by one or more of the computing devices described herein, such as in-vehicle computing system 109 of FIG. 1 and/or mobile device 128 of FIG. 1. Method 2200 may be performed while presenting one or more of the user interfaces described in this disclosure. At 2202, the method includes receiving user input requesting a change in audio output. For example, the user input may be received at a user interface displayed via a display device within a vehicle or other audio environment. The user input may request a change in audio output by one or more speakers in the vehicle or other audio environment. If user input requesting a change in audio output is not received (e.g., "NO" at 2202), the method includes not adjusting audio output settings (e.g., maintaining audio settings according to a current setting or mode), as indicated at 2204.

If user input requesting a change in audio output is received (e.g., "YES" at 2202), the method includes determining if the requested change is directed to a particular audio parameter(s), as indicated at 2206. If the requested change is directed to a particular audio parameter(s) (e.g., "YES" at 2206), the method includes adjusting the particular audio parameter(s) according to the requested change, as indicated at x08. For example, the adjustment may include adjusting a volume (e.g., increasing or decreasing a volume per the requested change, or setting a volume at a requested level), as indicated at 2210. At 2212, the adjustment may include adjusting equalizer settings for one or more speakers, such as treble, bass, and/or other equalization parameters. At 2214, the adjustment may include adjusting a balance and/or fade of one or more speakers (e.g., relative volumes of different speakers to bias one or more speakers over one or more other speakers, or to balance the speakers to one another).

If the requested change is not directed to a particular audio parameter(s) (e.g., "NO" at 2206), the method includes determining if the requested change is directed to a simulated venue, as indicated at x16. For example, as described above, audio output may be adjusted in order to simulate audio output within a particular real or custom generated venue. If the requested change is directed to a simulated venue (e.g., "YES" at 2216), the method includes adjusting audio output to simulate sound output at a currently selected location (e.g., a default location or a location that was last selected via user input) in a requested venue, as indicated at 2218.

If the requested change is not directed to a simulated venue (e.g., "NO" at 2216), the method includes determining if the requested change is directed to a simulated listening location, as indicated at 2220. If the requested change is directed to a simulated listening location (e.g., "YES" at 2220), the method includes adjusting audio output to simulate sound output at a selected location in a currently selected venue (e.g., a default venue or a venue that was last selected or configured via user input), as indicated at 2222. If the requested change is not directed to a simulated listening location (e.g., "NO" at 2220), the method includes determining if the requested change is directed to selecting a mode or a preset, as indicated at 2224.

If the requested change is not directed to selecting a mode or preset (e.g., "NO" at 2224), the input may not be recognized, and the method may optionally include outputting an error indicating an unrecognized input, as indicated at 2226. The method may further include not adjusting audio output settings, as indicated at 2204, and returning to monitor for user input. If the requested change is directed to selecting a mode or preset (e.g., "YES" at 2224), the method may include adjusting audio output according to the selected mode or preset, as indicated at 2228. For example, the method may include automatically selecting a simulated venue and/or simulated listening location, and/or automatically adjusting one or more particular audio parameters according to a pre-configured setting or group of settings.

Figure 23:
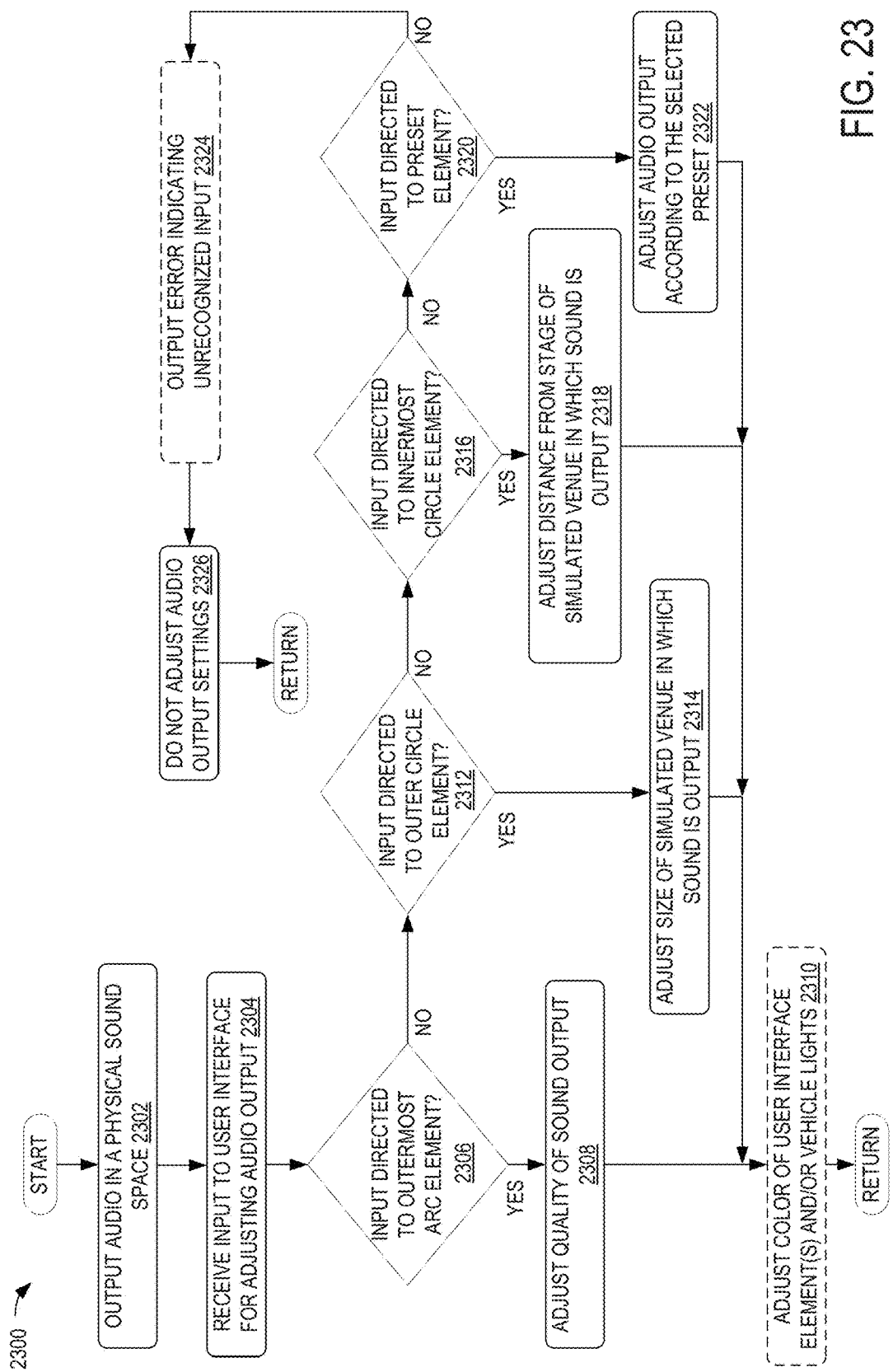

FIG. 23 is a flow chart of an example method 2300 for adjusting audio output using a user interface of a computing device. For example, method 2300 may be performed by one or more of the computing devices described herein, such as in-vehicle computing system 109 of FIG. 1 and/or mobile device 128 of FIG. 1. Method 2300 may be performed while presenting one or more of the user interfaces described in this disclosure, such as user interface 300 of FIG. 3. At 2302, the method includes outputting audio in a physical sound space, such as a passenger cabin of a vehicle or other audio environment. The audio may be output in the physical sound space with no adjustments to the input audio (e.g., audio received from an audio player that is directly or indirectly connected to the computing device performing the method, audio received from a memory that is local to or coupled via a network to the computing device performing the method, etc.) in some examples. In additional or alternative examples, the audio may be output in the physical sound space without adjusting the audio to simulate audio output in a different (e.g., virtual) environment. In further additional or alternative examples, the audio may be output in the physical sound space with adjustments to the input audio in order to simulate sound being output in a different (e.g., virtual) environment, per a default or previous user selected setting.

At 2304, the method includes receiving user input to a user interface to request a change in audio output. For example, the user input may be received at a user interface displayed via a display device within a vehicle or other audio environment. The user input may request a change in audio output by one or more speakers in the vehicle or other audio environment. At 2306, the method includes determining if the user input is directed to an outermost arc element of the user interface (e.g., adjustment element 310 of FIG. 3). If the input is directed to the outermost arc element of the user interface (e.g., "YES" at 2306), the method includes adjusting a quality of sound output, as indicated at 2308. For example, a quality of the sound output may be adjusted between two or more qualities, such as between "clean sound" and "powerful sound" in the example of FIG. 3. The method may further optionally include adjusting a color (e.g., a hue, intensity, or other quality) of one or more user interface elements and/or vehicle lights, as indicated at 2310 (e.g., as illustrated in FIGS. 5-9), to reflect the updated settings.

If the input is not directed to the outermost arc element of the user interface (e.g., "NO" at 2306), the method includes determining if the input is directed to an outer circle element of the user interface (e.g., outer circle 302 of FIG. 3), as indicated at 2312. If the input is directed to the outer circle element (e.g., "YES" at 2312), the method includes adjusting a size of a simulated venue in which sound is output, as indicated at 2314. As a non-limiting example, at 2302, audio may be output within a default venue having a default size. Continuing with the example, at 2314, the size of the default venue may be increased, such that the output sound is perceived to be output in a larger venue than the default venue. For example, an echo or reverberation parameter may be increased for larger venues, a number of surround sound speakers used to output the audio may be increased, and/or other audio features may be changed in order to cause the output sound to be perceived as being output within a larger venue. The method may optionally include adjusting the color of the user interface element(s), as indicated at 2310, and described above, in order to reflect the changes in audio settings.

If the input is not directed to an outer circle element of the user interface (e.g., "NO" at 2312), the method includes determining if the input is directed to an innermost circle element (e.g., inner circle 304 of FIG. 3), as indicated at 2316. If the input is directed to the innermost circle element (e.g., "YES" at 2316), the method includes adjusting a distance from a stage of a simulated venue in which sound is output, as indicated at 2318. For example, the audio may be adjusted to be perceived as originating from a farther or closer location relative to the audio that is output prior to the adjustment at 2318. The method may optionally include adjusting the color of the user interface element(s), as indicated at 2310, and described above, in order to reflect the changes in audio settings.

If the input is not directed to an innermost circle element of the user interface (e.g., "NO" at 2316), the method includes determining if the input is directed to a preset element (e.g., one of preset elements 314 of FIG. 3), as indicated at 2320. If the input is directed to a preset element (e.g., "YES" at 2320), the method includes adjusting audio output according to the selected preset, as indicated at 2322. For example, one or more characteristics of the sound may be adjusted according to predefined settings associated with the selected preset. In some examples, the sound may be adjusted to appear to be output from a model or type of speaker associated with the preset, as described above with respect to FIGS. 10-15. The method may optionally include adjusting the color of the user interface element(s), as indicated at 2310, and described above, in order to reflect the changes in audio settings.

If the input is not directed to a preset element (e.g., "NO" at 2320), the input may not be valid, and the method may optionally include outputting an error indicating an unrecognized input, as indicated at 2324. The method may further include not adjusting the audio output settings, as indicated at 2326, and returning to continue outputting audio and monitoring for user input. In some examples, input that is not directed to the arc element, outer circle element, inner circle element, or a preset element may be directed to other control elements of the user interface, such as a media control element (e.g., in media control panel 316 of FIG. 3). In such examples, the method may include performing the control operation associated with that other control element, in addition to or as an alternative to outputting the error at 2324 and/or not adjusting audio output settings at 2326.

Figure 24:
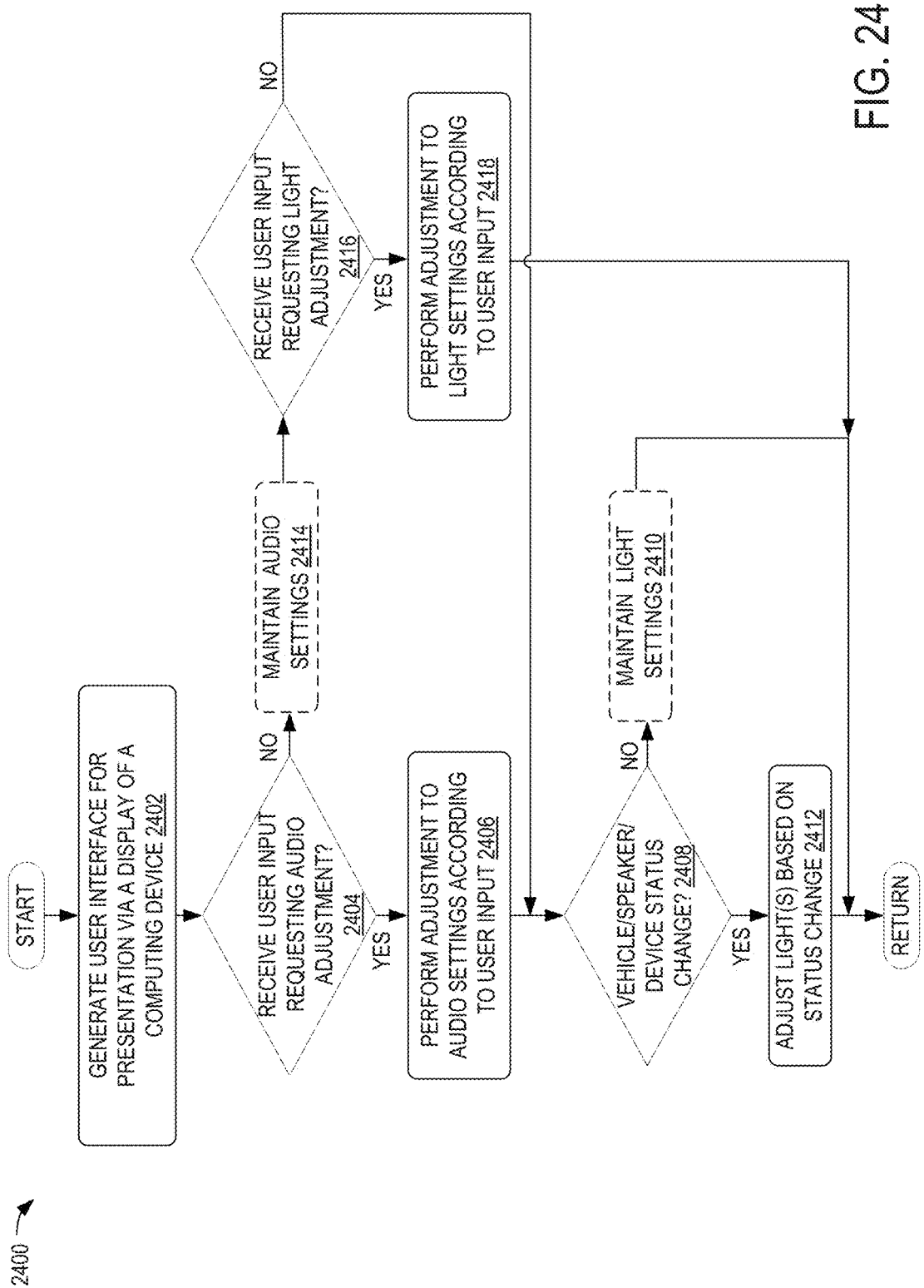
FIG. 24 is a flow chart of an example method of adjusting audio and light in a listening environment responsive to user input and/or status changes in accordance with one or more embodiments of the present disclosure.

FIG. 24 illustrates a flow chart of a method 2400 for adjusting audio output and/or light output in a listening environment based on user input and/or other factors. Method 2400 may be performed by an in-vehicle computing system and/or by a mobile computing device (e.g., a smartphone within a vehicle) that is communicatively coupled to a vehicle and/or in-vehicle computing system in order to transmit instructions and/or indications of instructions to control the audio and/or light output. For example, method 2400 may be performed by one or more of the computing devices described herein, such as in-vehicle computing system 109 of FIG. 1 and/or mobile device 128 of FIG. 1. Method 2400 may be performed while presenting one or more of the user interfaces described in this disclosure, such as user interface 300 of FIG. 3. At 2402, the method includes generating a user interface for presentation via a display of a computing device.

At 2404, the method includes determining whether user input requesting audio adjustment is received. If user input requesting audio adjustment is received (e.g., "YES" at 2404), the method includes performing an adjustment to the audio settings according to the user input, as indicated at 2406. For example, one or more of the audio settings adjustments described above, including one or both of the methods described with respect to FIGS. 22 and 23, may be performed at 2406. At 2408, the method includes determining whether a vehicle, speaker, and/or other device status has changed. Example status changes are described above, and include, as non-limiting examples, aspects of the user interface, the current sound output, a device syncing/pairing state, a vehicle entry, vehicle speeds or speed ranges, vehicle warnings, and/or other statuses. If no status change is detected (e.g., "NO" at 2408), the method proceeds to 2410 to optionally maintain light settings (e.g., not change light settings), and returns to continue monitoring for user input and/or status changes. If one or more status changes are detected (e.g., "YES" at 2408), the method proceeds to 2412 to adjust one or more lights based on the status change(s) that is detected. Example adjustments to lights based on status changes are described above with respect to FIG. 3.

If user input requesting audio adjustment is not received (e.g., "NO" at 2404), the method optionally proceeds to 2414 to maintain audio settings (e.g., not change audio settings). The method further includes determining whether user input requesting light adjustment(s) is received, as indicated at 2416. If user input requesting light adjustment(s) is not received (e.g., "NO" at 2416), the method proceeds to 2408 and selectively adjusts lights based on a status change as described above. If user input requesting light adjustment(s) is received (e.g., "YES" at 2416), the method proceeds to 2418 to perform adjustment(s) to light settings according to the user input. After adjusting the light settings, the method returns to continue monitoring for user input and/or status changes.

It is to be understood that any of the example user interface elements, gestures, and/or other features may be utilized in any combination within a given user interface for controlling sound output by vehicle speakers. In some examples, the user interfaces described herein may be utilized to control and/or adjust sound output by speakers other than vehicle speakers, such as portable speakers (e.g., connected to an in-vehicle computing system, mobile computing device, and/or other controlling device with a display for presenting one or more of the above-described user interfaces), home entertainment or studio speakers (e.g., connected to an audio receiver, mixer, or other controlling device with a display for presenting one or more of the above-described user interfaces), etc. Disclosure regarding control signals and/or instructions transmitted to one or more speakers (e.g., to adjust a sound output by the one or more speakers) may also refer to control signals and/or instructions transmitted to one or more audio processing devices for generating an adjusted audio signal according to the instructions. The audio processing device(s) may transmit the adjusted audio signal to one or more speakers in order to control the respective speakers to output sound according to the instructions. For example, the user interface may generate instructions reflecting a user input selection and, optionally, tag the instructions with one or more identifiers of speakers to be adjusted according to the instructions. The audio processing device(s) may generate audio control signals to different speakers based on the tags in some examples. In other examples, the audio processing device(s) may evaluate the control instructions generated responsive to input to the user interface in order to determine (e.g., independently, for each speaker) control signals for each speaker to produce the sound output requested via the user input.

A technical effect of the systems and methods described in this disclosure is that the sound output by speakers connected to the computing device providing one or more of the above-described user interfaces may be manipulated to simulate a selected sound experience (e.g., to mimic sound as perceived in a selected venue/venue size at a selected position relative to the stage of the venue). Another technical effect of the systems and methods described in this disclosure is that the user interface controls and associated generated audio control signals may increase the efficiency of the audio system relative to other audio systems that include generic equalization controls. For example, a single user input (e.g., increasing a size of a simulated venue, selecting a preset, etc.) may directly cause audio control signals for adjusting multiple different qualities of sound output by associated speakers.

Another example includes a computing device for adjusting audio output in a physical listening environment, the computing device including a display configured to present a user interface, a communication interface coupled to one or more speakers, a processor, and a storage device storing instructions executable by the processor to generate the user interface for presentation via the display, receive user input to the user interface requesting one or more adjustments to the audio output in the physical listening environment, the one or more adjustments including a geometric parameter of a simulated listening environment, and transmit, via the communication interface, instructions for performing the one or more requested adjustments to audio output by the one or more speakers. In a first example of the computing device, the physical listening environment may additionally or alternatively include a cabin of a vehicle, and the computing device may additionally or alternatively include an in-vehicle computing system in the vehicle or a mobile computing device. A second example of the computing device optionally includes the first example, and further includes the computing device, wherein the simulated listening environment includes a configurable venue, and wherein the user interface includes a control for changing a size of the configurable venue. A third example of the computing device optionally includes one or both of the first and the second examples, and further includes the computing device, wherein the simulated listening environment includes a configurable venue, and wherein the user interface includes a control for changing a distance from a stage of the configurable venue at which output audio is simulated to be perceived. A fourth example of the computing device optionally includes one or more of the first through the third examples, and further includes the computing device, wherein the user interface includes a first control and a second control for changing different geometric parameters of the simulated listening environment, the first and second controls being displayed as concentric circles, a size of the circle associated with the first control being adjustable to change a size of the simulated listening environment, and a size of the circle associated with the second control being adjustable to change a distance from a virtual stage of the simulated listening environment, and wherein the user input includes user input changing a size of one or both of the concentric circles. A fifth example of the computing device optionally includes one or more of the first through the fourth examples, and further includes the computing device, wherein the user interface further includes a third control for changing a sound characteristic of the audio output by the one or more speakers. A sixth example of the computing device optionally includes one or more of the first through the fifth examples, and further includes the computing device, wherein the user interface further includes a fourth control for directly changing one or more of treble, bass, balance, and volume of sound output in the physical listening environment. A seventh example of the computing device optionally includes one or more of the first through the sixth examples, and further includes the computing device, wherein the third control includes an arc extending around the first and second controls concentrically. An eighth example of the computing device optionally includes one or more of the first through the seventh examples, and further includes the computing device, wherein a fill color of one or more of the first, second, and third controls is selected according to a current setting of one or more of the first, second, and third controls. A ninth example of the computing device optionally includes one or more of the first through the eighth examples, and further includes the computing device, wherein the instructions are further executable to transmit instructions to a vehicle control system to control one or more lights within a vehicle to emit light having a color that is the same as a fill color of one or more controls of the user interface, the fill color of the one or more controls of the user interface being selected according to a current setting of one or more of the controls of the user interface. A tenth example of the computing device optionally includes one or more of the first through the ninth examples, and further includes the computing device, wherein the user interface includes one or more selectable preset elements, the one or more selectable preset elements corresponding to one or more pre-configured audio settings. An eleventh example of the computing device optionally includes one or more of the first through the tenth examples, and further includes the computing device, wherein a first preset element of the one or more preset elements corresponds to a selected model or type of speaker, and wherein, responsive to the user input including a selection of the first preset element, the instructions for performing the one or more requested adjustments to audio output by the one or more speakers include adjusting the audio output by the one or more speakers to simulate audio output by the selected model or type of speaker. A twelfth example of the computing device optionally includes one or more of the first through the eleventh examples, and further includes the computing device, wherein the user interface includes a geometric representation of the simulated listening environment including one or more selectable regions of the simulated listening environment, and wherein each selectable region is associated with a different simulated listening location within the simulated listening environment. A thirteenth example of the computing device optionally includes one or more of the first through the twelfth examples, and further includes the computing device, wherein the instructions are further executable to receive user input including a volume adjustment gesture, and transmit instructions for performing the requested volume adjustment responsive to receiving the gesture.

Another example includes a method for adjusting audio output in a vehicle, the method including presenting a user interface via a display in the vehicle, receiving user input to the user interface requesting one or more adjustments to the audio output in the vehicle, the one or more adjustments including a geometric parameter of a simulated listening environment, and transmitting instructions to one or more speakers of the vehicle for performing the one or more requested adjustments to audio output in the vehicle. In a first example of the method, the simulated listening environment may additionally or alternatively include a configurable venue, and the user interface may additionally or alternatively include a first control for changing a size of the configurable venue, and a second control for changing a distance from a stage of the configurable venue at which output audio is simulated to be perceived. A second example of the method optionally includes the first example, and further includes the method, wherein the first control and the second control include concentric circles, a size of the circle associated with the first control being adjustable to change the size of the configurable venue, and a size of the circle associated with the second control being adjustable to change the distance from the stage of the configurable venue, and wherein the user input includes user input changing a size of one or both of the concentric circles. A third example of the method optionally includes one or both of the first and the second examples, and further includes the method, wherein the user interface further includes a third control for changing a sound characteristic of the audio output by the one or more speakers, the third control including an arc extending around the first and second controls concentrically. A fourth example of the method optionally includes one or more of the first through the third examples, and further includes the method, further comprising selecting a fill color of one or more of the first, second, and third controls according to a current setting of one or more of the first, second, and third controls.

Another example includes an in-vehicle computing system of a vehicle, the in-vehicle computing system including a display device configured to present a user interface, a communication interface coupled to one or more speakers of the vehicle, a processor, and a storage device storing instructions executable by the processor to display the user interface via the display device, the user interface including a first control for changing a size of a simulated venue in which audio is output by the one or more speakers, and the user interface including a second control for changing a distance from a stage of the simulated venue at which output audio is simulated to be perceived, receive user input to the user interface requesting one or more adjustments to the audio output in the vehicle according to the simulated venue, and transmit, via the communication interface, instructions for performing the one or more requested adjustments to audio output by the one or more speakers.

Another example includes a method on a computing device for adjusting audio output and lighting output in a physical listening environment, the method including generating a user interface for presentation via a display of the computing device, receiving user input to the user interface requesting one or more adjustments to the audio output in the physical listening environment, transmitting, to one or more speakers, instructions for performing the one or more requested adjustments to the audio output in the physical listening environment, and transmitting, to one or more light sources and/or light source controllers, instructions for setting one or more light parameters of the light sources based on one or more of: the one or more requested adjustments to the audio output, a current status of the vehicle, a current status of the computing device, a parameter of audio currently output by the one or more speakers, and a user input provided to the computing device. In a first example of the method, the computing device may additionally or alternatively include an in-vehicle computing device and/or a mobile computing device. A second example of the method optionally includes the first example, and further includes the method, wherein the instructions for setting one or more light parameters of the light sources is based on output from a sensor in the computing device and/or a vehicle. A third example of the method optionally includes one or both of the first and the second examples, and further includes the method, wherein the sensor includes an accelerometer. A fourth example of the method optionally includes one or more of the first through the third examples, and further includes the method, wherein the instructions for setting one or more light parameters of the light sources is based on detecting that a selected speaker of the one or more speakers has been removed, or detecting that an additional speaker has been added to the physical listening environment. A fifth example of the method optionally includes one or more of the first through the fourth examples, and further includes the method, further comprising displaying an alert on the user interface responsive to detecting that a selected speaker of the one or more speakers has been removed, or responsive to detecting that an additional speaker has been added to the physical listening environment.

The description of embodiments has been presented for purposes of illustration and description. Suitable modifications and variations to the embodiments may be performed in light of the above description or may be acquired from practicing the methods. For example, unless otherwise noted, one or more of the described methods may be performed by a suitable device and/or combination of devices, such as the in-vehicle computing system 109, mobile device 128, and/or speaker 112 described with reference to FIG. 1. The methods may be performed by executing stored instructions with one or more logic devices (e.g., processors) in combination with one or more additional hardware elements, such as storage devices, memory, hardware network interfaces/antennas, switches, actuators, clock circuits, etc. The described methods and associated actions may also be performed in various orders in addition to the order described in this application, in parallel, and/or simultaneously. The described systems are exemplary in nature, and may include additional elements and/or omit elements. The subject matter of the present disclosure includes all novel and non-obvious combinations and sub-combinations of the various systems and configurations, and other features, functions, and/or properties disclosed.

As used in this application, an element or step recited in the singular and proceeded with the word "a" or "an" should be understood as not excluding plural of said elements or steps, unless such exclusion is stated. Furthermore, references to "one embodiment" or "one example" of the present disclosure are not intended to be interpreted as excluding the existence of additional embodiments that also incorporate the recited features. The terms "first," "second," and "third," etc. are used merely as labels, and are not intended to impose numerical requirements or a particular positional order on their objects. The following claims particularly point out subject matter from the above disclosure that is regarded as novel and non-obvious.

The invention claimed is:

1. A computing device for adjusting audio output in a physical listening environment, the computing device comprising:
   a display configured to present a user interface;
   a communication interface coupled to one or more speakers;
   a processor; and
   a storage device storing instructions executable by the processor to:
      generate the user interface for presentation via the display;
      receive user input to the user interface requesting one or more adjustments to the audio output in the physical listening environment, the one or more adjustments including a geometric parameter of a simulated listening environment;
      transmit, via the communication interface, instructions for performing the one or more requested adjustments to the audio output by the one or more speakers; and
      control a selected parameter of one or more lights in the physical listening environment in response to the one or more requested adjustments to the audio output.

2. The computing device of claim 1, wherein the physical listening environment includes a cabin of a vehicle, wherein the computing device comprises an in-vehicle computing system in the vehicle or a mobile computing device, and wherein the one or more lights in the physical listening environment include at least one of one or more interior or exterior lights of the vehicle.

3. The computing device of claim 1, wherein the simulated listening environment includes a configurable venue, and wherein the user interface includes a control for changing a size of the configurable venue.

4. The computing device of claim 1, wherein the simulated listening environment includes a configurable venue, and wherein the user interface includes a control for changing a distance from a stage of the configurable venue at which output audio is simulated to be perceived, the stage including a sound source location of the configurable venue.

5. The computing device of claim 1, wherein the user interface includes a first control and a second control for changing different geometric parameters of the simulated listening environment, the first and second controls being displayed as concentric circles, a size of the circle associated with the first control being adjustable to change a size of the simulated listening environment, and a size of the circle associated with the second control being adjustable to change a distance from a virtual stage of the simulated listening environment, and wherein the user input includes user input changing the size of one or both of the concentric circles.

6. The computing device of claim 5, wherein the user interface further includes a third control for changing a sound characteristic of the audio output by the one or more speakers.

7. The computing device of claim 6, wherein the user interface further includes a fourth control for directly changing one or more of treble, bass, balance, and volume of the audio output in the physical listening environment.

8. The computing device of claim 6, wherein the third control includes an arc extending around the first and second controls concentrically.

9. The computing device of claim 6, wherein a fill color of one or more of the first, second, and third controls is selected according to a current setting of one or more of the first, second, and third controls.

10. The computing device of claim 1, wherein the instructions are further executable to transmit instructions to a vehicle control system to control one or more lights within a vehicle to emit light having a color that is the same as a fill color of one or more controls of the user interface, the fill color of the one or more controls of the user interface being selected according to a current setting of the one or more of the controls of the user interface.

11. The computing device of claim 1, wherein the user interface includes one or more selectable preset elements, the one or more selectable preset elements corresponding to one or more pre-configured audio settings, wherein the selected parameter of the one or more lights is a first parameter, and wherein a second, different parameter of the one or more lights is controlled based on at least one of a state of the physical listening environment or a media parameter of a currently-output media item.

12. The computing device of claim 11, wherein a first preset element of the one or more selectable preset elements corresponds to a selected model or type of speaker, wherein, responsive to the user input including a selection of the first preset element, the instructions for performing the one or more requested adjustments to the audio output by the one or more speakers include adjusting the audio output by the one or more speakers to simulate audio output by the selected model or type of speaker, and wherein the first parameter is a hue of the one or more lights and the second parameter is an intensity of the one or more lights.

13. The computing device of claim 1, wherein the user interface includes a geometric representation of the simulated listening environment including one or more selectable regions of the simulated listening environment, and wherein each selectable region is associated with a different simulated listening location within the simulated listening environment.

14. The computing device of claim 1, wherein the instructions are further executable to receive user input including a volume adjustment gesture, and transmit instructions for performing a requested volume adjustment responsive to receiving the gesture.

15. A method for adjusting audio output in a vehicle, the method comprising:
presenting a user interface via a display in the vehicle;
receiving user input to the user interface requesting one or more adjustments to the audio output in the vehicle, the one or more adjustments including a geometric parameter of a simulated listening environment;
in response to the user input, transmitting instructions to one or more speakers of the vehicle for performing the one or more requested adjustments to the audio output in the vehicle; and
transmitting instructions to control one or more lights of the vehicle to emit one or more colors selected for at least one of a feature of a currently-played media item or a state of the vehicle.

16. The method of claim 15, wherein the simulated listening environment includes a configurable venue, and wherein the user interface includes a first control for changing a size of the configurable venue and includes a second control for changing a distance from a stage of the configurable venue at which output audio is simulated to be perceived.

17. The method of claim 16, wherein the first control and the second control include concentric circles, a size of the circle associated with the first control being adjustable to change the size of the configurable venue, and a size of the circle associated with the second control being adjustable to change the distance from the stage of the configurable venue, and wherein the user input includes user input changing the size of one or both of the concentric circles.

18. The method of claim 17, wherein the user interface further includes a third control for changing a sound characteristic of the audio output by the one or more speakers, the third control including an arc extending around the first and second controls concentrically.

19. The method of claim 18, further comprising selecting a fill color of one or more of the first, second, and third controls according to a current setting of one or more of the first, second, and third controls.

20. An in-vehicle computing system of a vehicle, the in-vehicle computing system comprising:
a display device configured to present a user interface;
a physical communication interface coupled to one or more speakers of the vehicle;
a processor; and
a storage device storing instructions executable by the processor to:
display the user interface via the display device, the user interface including a first control for changing a size of a simulated venue in which audio is output by the one or more speakers, and the user interface including a second control for changing a distance from a stage of the simulated venue at which output audio is simulated to be perceived;
receive user input to the user interface requesting one or more adjustments to the audio output in the vehicle according to the simulated venue;
adjust a color of at least one of the first control or the second control in response to the requested one or more adjustments to the audio output;
transmit, via the communication interface, instructions for performing the one or more requested adjustments to the audio output by the one or more speakers; and
transmit, via the communication interface, instructions for controlling at least one of one or more interior or exterior lights of the vehicle to emit light having a color that is a same color as the color of at least one of the first control or the second control as adjusted in response to the requested one or more adjustments to the audio output.

* * * * *